(12) United States Patent
LaFollette et al.

(10) Patent No.: US 7,462,419 B2
(45) Date of Patent: Dec. 9, 2008

(54) MICROSCOPIC BATTERIES FOR MEMS SYSTEMS

(75) Inventors: Rodney M. LaFollette, Provo, UT (US); Linton G. Salmon, Shaker Heights, OH (US); John N. Harb, Orem, UT (US)

(73) Assignee: Bipolar Technologies, Inc., Provo, UT (US)

( * ) Notice: Subject to any disclaimer, the term of this patent is extended or adjusted under 35 U.S.C. 154(b) by 881 days.

(21) Appl. No.: 10/982,270

(22) Filed: Nov. 5, 2004

(65) Prior Publication Data

US 2005/0093380 A1    May 5, 2005

Related U.S. Application Data

(63) Continuation of application No. 09/930,539, filed on Aug. 14, 2001, now Pat. No. 7,166,384, which is a continuation of application No. 09/037,801, filed on Mar. 10, 1998, now abandoned.

(51) Int. Cl.
*H01M 10/00* (2006.01)
*H01M 6/00* (2006.01)

(52) U.S. Cl. .................. 429/122; 429/7; 429/162; 29/623.1; 29/623.5

(58) Field of Classification Search ............ 429/122, 429/121, 304, 236, 234, 124, 157, 208, 7, 429/127, 162, 185, 192, 193, 194, 218, 247, 429/248; 29/623.1, 623.5; 359/265, 275; 204/421

See application file for complete search history.

(56) References Cited

U.S. PATENT DOCUMENTS

| | | | | |
|---|---|---|---|---|
| 2,800,616 A | | 7/1957 | Becker | 317/230 |
| 3,536,963 A | | 10/1970 | Boos | 317/230 |
| 3,558,357 A | | 1/1971 | Takahashi et al. | 136/6 |
| 3,634,736 A | | 1/1972 | Boos et al. | 317/230 |
| 3,648,126 A | | 3/1972 | Boos et al. | 317/230 |
| 3,656,027 A | | 4/1972 | Isley | 317/230 |
| 4,014,730 A | | 3/1977 | Selover, Jr. et al. | 156/331 |
| 4,717,673 A | * | 1/1988 | Wrighton et al. | 436/68 |
| 5,110,696 A | * | 5/1992 | Shokoohi et al. | 429/218 |
| 5,437,941 A | * | 8/1995 | Arledge et al. | 429/129 |
| 5,455,126 A | * | 10/1995 | Bates et al. | 429/127 |
| 5,631,099 A | * | 5/1997 | Hockaday | 429/30 |
| 5,759,712 A | * | 6/1998 | Hockaday | 429/30 |
| 6,045,942 A | * | 4/2000 | Miekka et al. | 429/124 |

OTHER PUBLICATIONS

Bates. J.B., et al. "Thin Film Li-LiMn$_2$O$_1$ Batteries", May 1995 IEEE, pp. 319-322.

Xuejie Huang, et al., "All-Solid-State Lithium Microbatteries.", *Journal of Power Sources*. Elsevier Sequoia. 1993. pp. 487-492.

(Continued)

*Primary Examiner*—Raymond Alejandro
(74) *Attorney, Agent, or Firm*—Lynn G. Foster

(57) ABSTRACT

Microscopic batteries, integratable or integrated with and integrated circuit, including a MEMS microcircuit, and methods of microfabrication of such microscopic batteries are disclosed.

31 Claims, 6 Drawing Sheets

OTHER PUBLICATIONS

Bult, K., et al., "Wireless Integrated Microsensors." *Technical Digest of the 1996 Solid-State Sensor and Actuator Workshop*, Hilton Head Island. S.C., p. 205, Jun. 1996.

Rose, M.F., "Performance Characteristics of Large Surface Area Chemical Capacitors." *Proceedings of International Power Sources Symposium*, 33, Cherry Hill, N.J., p. 572, Jun. 1988.

Stout, M.G., et al., "A Multichip Module Implementation of a Neural Network." *Proceedings of IEEE Multichip Module Conference*, p. 20 (1994).

Boos, D.L., Adams, H.A.. Hacha. T.H., Medtcalf, J.El, "A 3 Cubic Inch 200,000 Microfarad Capacitor," *Proceedings of the 21st Electronic Components Conference*, p. 38 (1971).

NASA Tech Briefs. "Electronic Components and Circuits." Mar. 1998, pp. 46-46.

*Solid State Ionics*, vol. 9 & 10 (Part II). 1993. North-Holland Publishing Company—Amsterdam.

See "Appendix A."

* cited by examiner

Battlefield Map

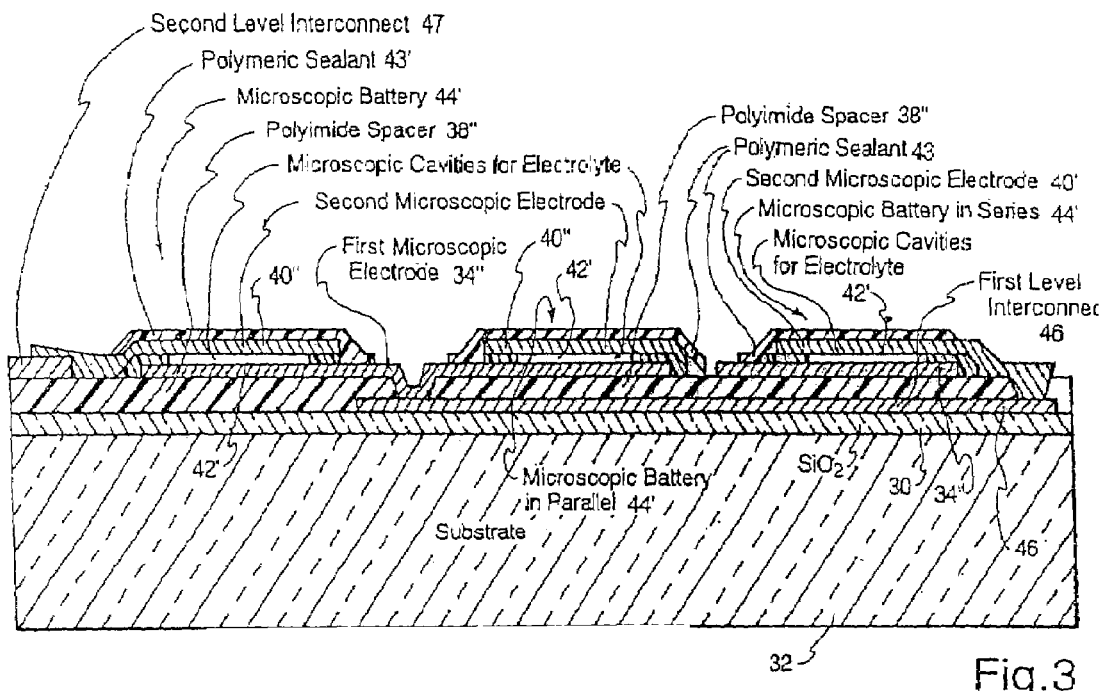
Fig. 3
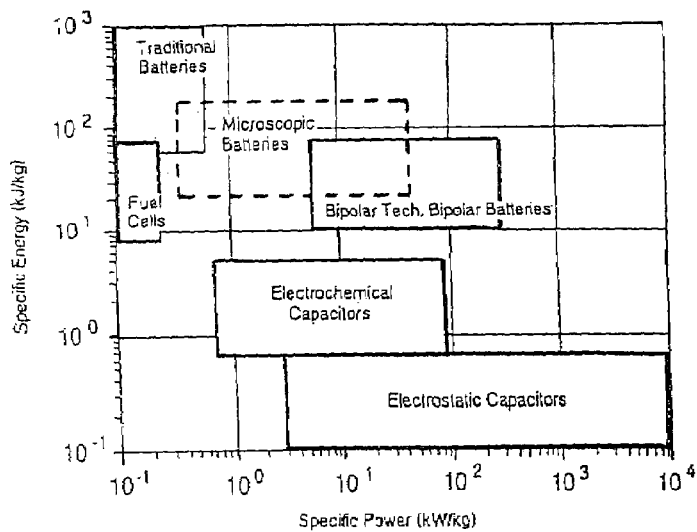
Fig. 17
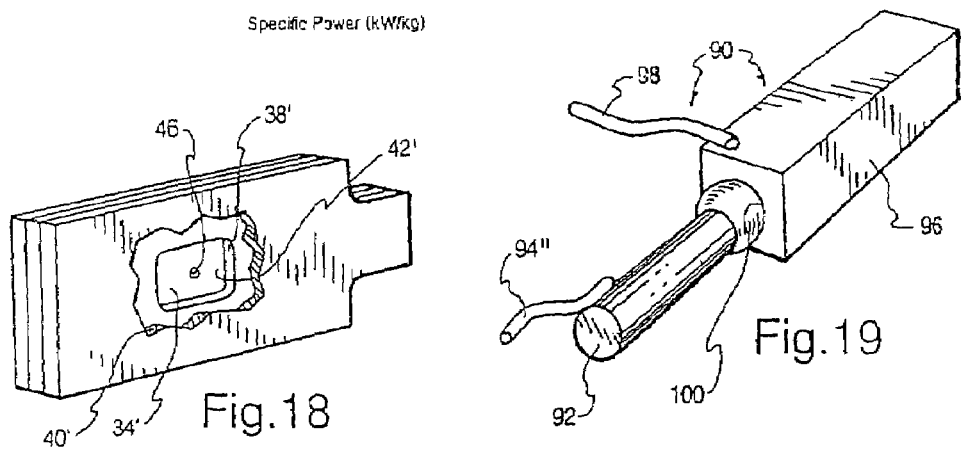
Fig. 18
Fig. 19

MICROSCOPIC BATTERIES FOR MEMS SYSTEMS

This application is a continuation of our U.S. patent application Ser. No. 09/930,539, filed Aug. 14, 2001, now U.S. Pat. No. 7,166,384 which is a continuation of U.S. patent application Ser. No. 09/037,801, filed Mar. 10, 1998, now abandoned.

GOVERNMENTAL SPONSORSHIP

This invention was made with Government support under contract F29601-96-C-0078 and F33615-96-C-2674. awarded by the United States Department of the Air Force. The Government has certain rights in the invention.

THE FIELD OF THE INVENTION

This invention relates generally to electrical power sources and more particularly to microscopic batteries some forms of which are integrated or integratable with and providing internal power to MEMS and integrated microcircuits, either on a retrofit or original manufacture basis. MEMS (microelectromechanical systems) involve the fabrication and use of miniature devices which comprise microscopic moving parts (such as motors, relays, pumps, sensors, accelerometers, etc.). MEMS devices can be combined with integrated circuits, and can perform numerous functions.

BACKGROUND OF THE INVENTION

Integrated circuits, including microelectronic circuits, have been used extensively, and have the advantage of small size and low production costs particularly when produced on a large scale. A class of integrated circuits that are of particular interest comprise microelectronic circuits having at least one MEMS device. MEMS may comprise complex engineering systems comprising microscopic mechanical elements, such as motors, pumps, relays, sensors, accelerometers and other components, which are powered by electrical energy. MEMS devices make possible controlled physical movement of tiny parts within miniature circuits.

MEMS devices have the potential to revolutionize computational technology. The concept of MEMS fabrication provides the promise of low cost comparable to the cost effectiveness in producing integrated electronic circuitry. MEMS can include sensing and actuating components. In defense systems, MEMS are expected to revolutionize the gathering, evaluation, and communication of militarily-significant information. "MEMS will create new military capabilities, make high-end functionality affordable to low-end military systems, and extend the operational performance and lifetimes of existing weapons platforms." (Department of Defense [DOD], 1995).

The great strength of MEMS as a technology fundamentally depends on: 1) the ability of MEMS to obtain increased functionality in a single, integrated system; 2) the low-cost, high-volume nature of MEMS fabrication; and 3) the overall reduction in size and mass of sensor/actuator systems. Heretofore, MEMS technology has typically focused on the need to fabricate MEMS and electronic devices that meet these three goals, but has failed to address the difficult problem of electrical energy availability and management. The overall goals of many MEMS applications has not and will not be met unless one or more appropriate MEMS power sources are developed.

While power and energy availability and management are problems for all integrated circuits, they are acute problems for MEMS. Many MEMS devices require periodic power pulses. Conventional wisdom has required and still requires that electrical power be supplied from relatively large, heavy external sources. Moving electrical current into an integrated circuit from such an external power source is difficult, and results in high power losses, particularly for a MEMS circuit where high capacities are required. Additionally, present MEMS devices must be continuously connected to the external power source. Thus, autonomous (self-contained), portable or remote operation of MEMS devices (such as MEMS sensors) is difficult if not impossible to achieve using an external fixed power source. It is reported that the 1994 market for MEMS was $500M. The projections of potential future market, based on expected growth of existing markets and expansion into anticipated markets within a decade, are that the production of MEMS will approach $3 billion per year.

A large fraction of MEMS production presently occurs in two areas, sensors and accelerometers ($200M/year). These two markets are expanding very rapidly at present. In addition, other types of MEMS applications are rapidly emerging. Presently, none of these devices are using integrated batteries, because none exist, nor have they previously been invented and developed.

One analysis of the MEMS sensor and accelerometers applications are that nearly 100% of the sensor market, and approximately 30% of the accelerometer market, would use microscopic batteries, if they were available. On this basis, it is estimated that a market for microscopic batteries in these two fields would be $50M/year, if such a product existed. Other significant markets would also come into place if a microscopic battery could be provided, such that within a decade microscopic batteries, would have a market of over $100M/year.

While the storage of energy in miniature, rechargeable devices for MEMS application is contrary to the state-of-the-art, a long term unsatisfied need for such has existed. If miniature energy sources were inventively created, significant advantages would be obtained, which are not presently available. First, more autonomous MEMS devices could be produced because the present dependency on continuous supply of power from an external source would be overcome. Second, significant improvement in energy efficiency would result. The supply of electrical energy would be at low power, stored temporarily, and then released at higher power levels in close proximity to the point of use, thus reducing overall power losses. Third, the cost of the MEMS system its integrated power supply would be lowered by reducing the complexity of electrical connections. Presently, it is difficult if not impossible to effectively store energy locally within a MEM system. Miniature capacitors have unacceptable useful discharge times (and hence unacceptable energy storage capacity). Fourth, cells can selectively be arrayed in series and in parallel to achieve different (and variable) combinations of operating voltage and capacity.

Further, unitary simultaneous formation, for example, of a microcircuit, one or more MEMS devices and a microscopic battery would provide a substantial advantage.

Presently, batteries for MEMS devices are unsatisfactory external power sources, which undesirably contributing to both the overall weight and volume of the MEMS device, and have other disadvantages. There are two primary reasons for this. The first primary reason is the size of the batteries. The smallest commercial batteries are the button-shaped energy cells used in watches, calculators and hearing aids. These are huge when compared with the MEMS to which such an external battery heretofore has supplies power. The second primary reason is that the need for energy supply in MEMS is at a relatively high power level. High power is often needed to produce mechanical movement in MEMS devices. Commercially available batteries typically maximize the amount of energy they store, as opposed to providing high power release of stored energy. Consequently, conventional external batteries must be overly large in order to supply the power levels required by the circuit.

A further limitation of present commercially available external batteries for MEMS is that no small batteries are rechargeable batteries. Rechargeability is mandated by many MEMS applications.

Table 1, below, compares the characteristics of several power source solutions with respect to size, weight, capacity, and assembly difficulty. Table 2, below, is a partial list of potential DOD applications for MEMS taken from the text "Microelectromechanical Systems: A DOD Dual Use Technology Industrial Assessment" (DOD, 1995), together with an indication of the power source requirements for the majority of applications in the given area. As stated above, a significant portion of MEMS production presently occurs in two areas, sensors and accelerometers. Military applications for remote sensors and accelerometers include: safing and arming of fuses; friend or foe identification; embedded sensors for system integrity monitoring; communications systems monitoring, such as with satellites; low power mobile displays; flexible sensing surfaces; and numerous others.

Many of the application areas in Table 2 will require an integrated or integrable microscopic battery power. In general, systems that require mobile, autonomous, extensively-integrated sensors will require microscopic batteries. A requirement for mobility excludes standard wired power sources. A requirement for autonomy excludes primary battery systems that cannot provide power to integrated systems for extended periods. Requirements for small size, extensive integration and large numbers of units exclude the use of coin-type or standard format batteries because of the difficulty of mounting such batteries into the format required by integrated systems. Microscopic batteries, once available, will have performance advantages that will prove to be critical to specific system applications, such as multiple, definable voltage levels, lower power requirements, and better power distribution.

TABLE 1

Qualitative Comparison of Power Source Characteristics

| Power Source | Size | Weight | Energy Capacity | Assembly Difficulty |
|---|---|---|---|---|
| From a Wall Socket | Very Large | N/A | High | N/A |
| Battery Pack | Large | Heavy | Moderate | Very Difficult |
| Button Cell | Small | Light | Low | Difficult |
| Microscopic Battery | Microscopic | Very Light | Low | Expected to be Simple |

TABLE 2

MEMS Applications and Associated Power Source Requirements

| Application Requirements | Remote Sensing Arrays | Flexible Sensing Surfaces | Integrated Fluidic Systems | Safing and Arming | Low-Power Displays | Embedded Sensors | MicroOpto Mechanical Systems |
|---|---|---|---|---|---|---|---|
| Size | Microscopic | Microscopic | Small | Microscopic/ Small | Small/ Large | Microscopic/ Small | Microscopic/ Small |
| Weight | Very Light | Very Light | Light/ Heavy | Light/ Very Light | Light/ Heavy | Light/ Very Light | Heavy/ Light |
| Energy Capability | Low | Low | Moderate | Low | Moderate | Low | Low/ Moderate |
| Assembly Difficulty | Expected to be Simple | Expected to be Simple | Moderate | Expected to be Simple/ Moderate | Moderate | Expected to be Simple/ Moderate | Expected to be Simple/ Moderate |
| Recharge Capability | Required | Required | Not Always Required | Not Always Required | Required | Required | Not Always Required |
| Applicable Power Solution | Microscopic Battery | Microscopic Battery | Coin/ Microscopic Battery | Coin/ Microscopic Battery | Battery Pack/ Microscopic Battery | Microscopic Battery | Coin/ Microscopic Battery |

FIG. 17 (adapted from Raistrick, 1992 and Olszewski and Morris, 1987) contrasts the power and energy capabilities of several prior energy storage technologies. Traditional electrostatic capacitors have the highest peak specific power (up to $10^4$ kW/kg) of prior technologies. The two major disadvantages of electrostatic capacitors are low specific energy and exponential discharge behavior. Specific energies are 0.01-0.1 J/g. The exponential decay in power output vs. time is not suitable for applications which require a flatter discharge profile. The advantage of electrostatic capacitors is that high voltages are possible, limited only by the ability of the dielectric material to sustain the voltage. The surface areas of the capacitor plates, where the charge is stored, are not high. Efforts to improve specific energy by increasing the plate areas have not achieved the objective.

Double layer capacitors, which have existed for decades (Becker, 1957) are not capable of high potential differences (<3 V, as opposed to >10 V for electrostatic capacitors), but through the use of high surface area material in the electrodes, energy densities can be made to be much higher than electrostatic capacitors. High surface area carbon and sulfuric acid are the most common electrode material and electrolyte. Specific energies of 0.05-0.8 J/g are considered typical (Boos, 1970; Boos et al., 1971; Currie et al., 1985; Boos and Metcalf, 1972 and Isley 1972; Selover et al., 1977; Rose, 1988; Rose, 1989). Peak specific powers are typically 10-30 W/g. Miniaturization of these very high surface area materials, however, would be difficult, if not impossible.

A more thorough treatment of recent advances in capacitor technology are given by Raistrick (1992) and Oxley (1988). Progress has been made through the use of improved electrodes and electrolytes, but attempts to provide a combination of very high specific power (>50 W/g) and specific energy (>30 J/g) have failed using capacitor technology.

A variety of electrochemical capacitors exist, which have been developed, and which have been substantially improved during the past decade. These range in their mode of operation from double-layer capacitors, which strictly use non-faradaic processes, to devices which are somewhat similar to batteries and which use faradaic reactions to release energy. Intermediate devices exist between pure double layer capacitors and batteries in their operation. During discharge of these devices, the double-layer releases a charge, but the electrode surfaces themselves also undergo faradic (charge transfer) reactions. Hence, these intermediate devices employ both faradaic (bulk) and non-faradaic (surface) reactions, which increase the energy which can be stored in the cell.

In contrast to capacitors, traditional secondary (rechargeable) batteries, which store energy in chemical form, have the highest specific energy of the technologies presented in FIG. 5 (i.e. 90-400 J/g for existing Systems, up to 3000 J/g for some systems under development). Batteries have normally been designed to maximize the specific energy, at the expense of the specific power. Typical specific power values are low, i.e. 0.03-0.3 W/g (Linden, 1984).

Of the available electrical energy storage technologies, batteries are probably the leading candidate for use in MEMS. As shown in FIG. 17, batteries can be designed to provide adequate levels of both power and energy. The major obstacle in using batteries in MEMS is the size and weight of available batteries. To date, large external batteries have been used. Internal batteries must be microscopic, not macro-scopic. Dimensions must be in micrometers, rather than centimeters, and good specific power and specific energy must be available. Presently, the smallest external batteries available commercially are of the order of 0.1 to 1 cm$^3$ in volume and 1 to 3 g in weight. For example, button cells employing a variety of electrochemical couples (such as silver/zinc, zinc/air, and lithium/manganese dioxide), are built which are approximately 1.06 cm$^2$ in cross-sectional area, are 0.54 cm in height, and weigh 1 to 3 g (Linden, 1984). The open circuit potential of these single cells is 1.5 to 3.0 V. The highest capacity batteries in this class can deliver 1440 C of energy, with a specific energy of 100-1000 J/g (400-3200 J/cm$^3$). The biggest difficulty in their use to power MEMS, along with their size and weight, is the fact that all such batteries are primary and are not secondary or rechargeable batteries.

Batteries for internal MEMS applications would need to have several important characteristics. First, many MEMS applications require the capability of large numbers of repeated charge/discharge cycles. Second, they must have a minimum of internal resistance to limit energy losses during battery operation. Third, they must be robust, so that changes in temperature, pressure, and other conditions do not damage performance. Fourth, MEMS batteries must be produced in large quantities, at low cost, and low rejection rate.

Recently, efforts have been made to provide smaller secondary (rechargeable) batteries which can operate at very high efficiency. Such smaller secondary batteries are far larger than microscopic circuits. Smaller bipolar lead acid batteries have been built and demonstrated, which had open circuit potentials of 2-8 V (1-4 V per individual cell). (LaFollette 1988; LaFollette and Bennion, 1990). These batteries were designed for high efficiency to produce very short bursts (0.1-100 ms) of very high levels of power. These batteries produced up to 5 A for 1-2 ms, for a power output of 35 W during that time. Their specific energy was approximately 70 J/g which, though modest by battery standards, is far better than capacitors. Peak specific power was 200-800 W/g (800-3000 W/cm$^3$). Typical values for commercially available batteries are 0.1 W/g or 0.4 W/dm). This specific power was achieved through the use of an efficient bipolar cell design, and the use of lightweight, high performance cell components. These batteries can also deliver multiple, high power discharges without a significant recharge (LaFollette, 1995).

While these efforts at building smaller batteries represent a decrease of two orders of magnitude in battery size from traditional batteries, the batteries in question are large when compared to the microscopic size needed to provide internal circuit power to a MEMS. What is required is an entirely new class of batteries (i.e. microscopic batteries) with peak specific powers much higher than present batteries, with specific energies many times that of capacitors, and which are built on a microscopic scale suitable for internal integration either into an existing MEMS, for retrofit purposes, or unitarily fabricated as part of the MEMS, for original manufacturing purposes.

The art includes certain thin-film batteries, which are also large by microelectronics standards. Included in this category are lithium batteries which may be able to provide high specific energy (Levasseur et al., 1989). The first totally thin-film rechargeable lithium battery was a Li/TiS$_2$ cell built by Kanehori, et al (1983). Since that time a variety of cells with different electrolyte and cathode materials have been made. In spite of their differences, all of these thin-film batteries use an evaporated layer of metallic lithium as the anode.

The most common electrolyte used in solid-state lithium batteries is a lithium glass. For example, $xLi_2O\text{-}yB_2O_3$ or $xB_2O_3\text{-}yLi_2O\text{-}zLi_2SO_4$ (Jones et al., 1994; Levasseur et al., 1989; Balkariski et al., 1989) may be used. These glasses are typically sputter-deposited at a thickness less than 5 µm. The resulting electrolyte layers have room temperature ionic conductivities ranging from $10^{-9}$ to $10^{-5}$ S/cm, depending on the composition of the electrolyte (Jones et al., 1994). In contrast, the ionic conductivity of a 5M KOH electrolyte is approximately 0.5 S/cm. One of the key problems with the lithium glass electrolytes has been an absence of long term stability in contact with metallic lithium (Bates, et al., 1993). This problem has been pursued by the Eveready Battery Company (EBC). A thin layer of LiI was deposited by vacuum evaporation between the lithium electrode and the glassy electrolyte (Jones et al., 1994). The LiI, however, has a conductivity which is less than 1/100th of the glassy electrolyte and was, therefore, kept as thin as possible. An alternate attempt to solve the stability problem was recently undertaken by Oakridge National Laboratories (ORNL), which developed a LiPON electrolyte which is stable when in contact with lithium (Bates, et al. 1993).

A common characteristic of cathodes used in thin-film lithium batteries is that they are all lithium intercalation compounds which have open channels through which Li$^+$ ions can diffuse without severely disrupting the surrounding framework (Bates, et al., 1993). Two cathode materials which have been used in recent thin-film cells assembled by ORNL and EBC are V$_2$O$_5$ and TiS$_2$, respectively. While other cells are also described in the literature, these two cells appear to be representative of the current state-of-the-art.

Oakridge National Laboratories has recently assembled batteries with TiS$_2$, V$_2$O$_5$, and Mn$_2$O$_4$ cathodes which incorporate a LiPON electrolyte developed at Oakridge (Bates, et al, 1993). Of these, the Li/V$_2$O$_5$ cell exhibited the best performance with a capacity of 120 μA/cm$^2$. As with all intercalation electrodes, the cell voltage decreased steadily during constant current discharge, owing to insertion of lithium ions into the cathode. The cell was discharged from an open circuit voltage of 3.9 V to a cutoff voltage of 1.5 V at current densities of 100 μA/cM$^2$. According to the authors, cathode utilization decreased by only a few tenths of a percent or less per cycle. The authors also concluded that the cathode was the major contributor to the battery resistance.

The battery made by EBC uses sputter-deposited TiS$_2$ as a cathode and has an open circuit voltage of 2.5 when the cell is fully charged. This cell is typically operated in the potential range from 2.5 to 1.8 V. The cell may vary from 8 to 12 μm in thickness and have a capacity between 35 and 100 μAh/cm$^2$. This battery has a long cycle life. EBC batteries routinely complete more than 1000 cycles at current densities as high as 300 μA/cm$^2$ and have actually cycled more than 10,000 times at a current density of 100 μA/cm$^2$. These batteries are also able to deliver current pulses of two seconds duration at current densities of approximately 2 mA/cm$^2$. By comparison, four cell bipolar lead acid batteries have been constructed with a much larger total thickness of about 400 microns which discharged at a current density of 10-25 A/cm$^2$ for short duration pulses, over four orders of magnitude greater than the EBC cell. (LaFollette and Bennion, 1990)

Because lithium is highly reactive, it is essential that lithium batteries be sealed with a protective coating that is impermeable to both gas and water.

Lithium cells can also be assembled with a solid ion-conducting polymer as the electrolyte instead of the glass electrolytes (Owens, 1995). Such cells are not really thin-film cells since the thickness of the electrolyte (~50-100 μm) is typically much greater than that of a 1 μm thickness used in the thin-film cells. Polyethylene oxide was the initial polymer used in lithium polymer electrolyte cells. However, other polymeric electrolytes with increased room temperature conductivity have since been developed. The long term stability of the polymer and the formation of resistive layers at the metallic lithium/polymer interface are both issues of concern with respect to these cells.

Thin-film batteries, other than those based on lithium, have also been investigated. In particular, silver and copper systems have been examined because of the high ionic conductivity of silver- and copper-based solid electrolytes (Julien & Nazri 1994; Levasseur, et al, 1989). By and large, these batteries have been found to be impractical owing to their relatively high cost and- low energy density. One study of interest was performed by Takahashi and Yamamoto who fabricated a Ag/A$_3$SI/I$_2$,C cell (Takahashi & Yamamoto, 1971). Six of these cells were stacked entirely by vacuum evaporation and provided an OCV of 1.2 V at 25° C. The cells were discharged at a high rate of 10 mA/cm$^2$. Unfortunately, the cells are not without problems as the iodine oxidizes the solid electrolyte., Reference may be made to Levesseur, et al (1989) and Julien & Nazri (1994) for information on other types of nonlithium thin-film batteries.

Fuel cells are limited in their power output and specific energy due to the need for manifolding of individual cells to introduce fuel and oxidant into the cells and remove reaction products. The complexity of these systems would seem to preclude their consideration for adaption to microscopic size. Dyer has reported a proton exchange membrane fuel cell which is only 0.2 cm$^2$ in area (Dyer. 1990). The fuel cell can be mounted (according to the Dyer disclosure) directly onto a printed circuit. It consisted of a thin-film platinum electrode (<0.0001 cm) mounted on a substrate, a gas-permeable, proton exchange membrane separator which is only 0.0005 cm thick over this lower electrode, and a porous platinum electrode on the other side of the membrane. A mixture of hydrogen and oxygen is introduced into the vessel containing the fuel cell. Apparently, the membrane allowed hydrogen gas to move to the inner electrode, but restricted much of the oxygen mobility, thus allowing the fuel cell to operate. Power output was low (<0.005 W/cm$^2$), probably due to the diffusion resistance of the hydrogen transport to the inner fuel cell. The energy efficiency was probably also quite low, due to recombination of hydrogen and oxygen at the outer electrode. Power output from this fuel cell was low. While this technology is certainly promising, they can't store or deliver adequate energy for use as a microscopic source of electrical power for MEMS and other microcircuits. Fuel cells, of course, are difficult to recharge.

Previous efforts have been made to integrate a satisfactory source of electrical power and a MEMS. A number of different thin-film (but large area) batteries have been documented in the literature. Of these, rechargeable lithium batteries have shown the best performance, as demonstrated by excellent cycle life and shelf life. At least one notable effort to apply such batteries to use in conjunction with MEMS has been made by workers at Oak Ridge National Laboratory (Bates, et. al., 1993).

The lithium batteries are limited to low discharge rates. Therefore, the area of these thin-film batteries must be large in, order to increase the power available from the battery to acceptable levels. Also, lithium is very reactive with water and O$_2$ so that such batteries must be completely isolated from the environment to be useful. It is believed that the lithium batteries are relatively expensive to build. For example, the EBC battery uses TiS$_2$, which is a high cost cathode material.

It can be seen that if an integratable microscopic battery were made available it would fill an long existing, unsatisfied need in the MEMS and microelectronic technologies described above.

SUMMARY AND OBJECTS OF THE INVENTION

The present invention involves microscopic batteries, which comprise a very tiny footprint (area), typically on the order of 0.1 cm$^2$ down to 0.0001 cm$^2$, and accommodate direct integration into microcircuits, and/or MEMS, either on a retrofit or unitarily with the microcircuit and MEMS at the time of manufacture. The microscopic batteries of the present invention provide a solution to long existing MEMS energy and power management problems of the past, and will significantly enable MEMS technology for increased utilization. The present invention also involves novel methods of making microscopic batteries.

As mentioned above, one of the limiting factors in the operation of MEMS has been energy transmission and storage. In conventional practice, electrical energy for a MEMS is supplied from an external source into the microcircuit, which causes substantial power losses. The reduction of the power losses is a profoundly significant aspect of the present invention and is accomplished by the complete integration of the batteries of the invention with the MEMS or with a non-MEMS microelectronic circuit, either on a retrofit or unitary original manufacture basis.

Microscopic batteries of-the invention are adapted to be located internally within a MEMS or other microcircuitry, in close proximity to the requirements for power. During periods of high energy usage, high specific power is immediately available from the fully integrated internal microscopic battery, without significant power loss. In typical applications, the battery can be recharged from an external source at a lower rate, thus reducing power transmission losses although recharging is not normally required at frequent intervals. The battery serves as a load-leveling energy storage device. Thus, features of importance of the microbatteries of the invention are reduced power loss when integrated into a MEMS or like microscopic system, higher energy efficiency, remotely controlled microscopic robotics, and mobility via the autonomy of the system. The invention also embraces novel methods of microfabrication of microscopic batteries including unitary fabrication of the microscopic battery as an integrated part of an autonomous integrated circuit, such as MEMS. Such circuits, therefore, are complete with an internal microscopic source of electrical energy and can operate without any external power supply or connections thereto.

Rechargeable microscopic batteries of the present invention address and solve the power and energy problems heretofore associated with MEMS. Microscopic batteries of the invention offer far more energy storage capability than a capacitor, sufficient to operate MEMS for extended time periods from a single charge. Portable, remote and autonomous MEMS are thus accommodated by the invention. Substantial reduction in power losses is achieved in certain MEMS using an integrated microscopic battery according to the present invention.

The form and nature of a microscopic battery according to the present invention may vary significantly depending upon the specific intended purposes. Nevertheless, microscopic batteries of this invention typically will possess one or more of the following features, among others: (1) is an internal source of energy within a microcircuit which may also comprise a MEMS device; (2) is integrated at the time of manufacture or integratable thereafter, on a retrofit basis, with a MEMS or other microcircuit; (3) is microscopically small and light weight providing for portability and autonomy of an integrated system; (4) is highly efficient, providing high specific power and often high specific energy; power discharge values within the range of 10 W/cm$^2$ to 0.001 W/cm$^2$ being available depending on whether the electrolyte is liquid or solid, among other things; (5) can be charged and discharged a large number of times; (6) is most often a secondary battery but may be primary; (7) has low internal resistance, with very low power losses; (8) provides a footprint normally within a range on the order of one square millimeter to one square μm and a volume on the order of one cubic millimeter to one cubic μm; (9) comprises most often thin film deposited and etched electrodes; (10) in some configurations can be of a wire-in-a-can or peg-in-a-hole species; (11) often will comprise a series of interconnected cells which can be arranged to provide more than one output voltage; (12) is formed using film deposition, masking, spin-coating, sacrificial removal and photolithographic pattern etching techniques; (13) capable of manufacture using MEMS microfabricating techniques; (14) often is hermetically sealed; (15) can be rigid or conformal; (16) accommodate a large range of materials for use as microscopic electrodes and a microscopic quantity of electrolyte; (17) can be configured into thin flat cells, bipolar stacks, linear cells, concentric wire-like or tubular cells, and/or spirally wound embodiments; (18) the components of which can be successively layered upon either a rigid substrate or a flexible conformal base; (19) can be mass produced on a high quality/low cost basis; (20) is adaptable for recharging using one or more solar collectors; and (21) is reconfigurable by the user to change the characteristics of the microscopic battery where it is being or to be used.

With the foregoing in mind, it is a prime object of the invention to overcome or alleviate problems of the past by providing a microscopic battery.

Another major object of the present invention is the provision of microscopic batteries having one or more of the twenty-one features set forth above.

It is also an object of the invention to provide microscopic batteries, which accommodate integration into a microelectronic integrated circuit, either unitarily at the time of manufacture or later on a retrofit basis.

It is a further valuable object to provide an internal rechargeable battery integrated or integratable into a MEMS or non-MEMS microcircuit.

An object of significance is the provision of unique methodology by which microscopic batteries are made.

An additional object of dominance is the provision of novel methodology by which a microscopic battery and a MEMS or non-MEMS microcircuit are formed simultaneously and unitarily.

It is further an object of the invention to provide microscopic batteries with, significantly reduced size and improved power properties accommodating integration into a MEMS.

An object of significance is to integrate microscopic batteries with microscopic integrated circuits and/or MEMS, as internal low power loss sources of electrical power.

Yet another object of the invention is to provide microscopic batteries that can be used to efficiently power integrated circuits and MEMS circuits.

An important object of the invention it to provide a multi-cell microscopic battery system having at least two distinct voltage outputs.

Another object of the invention is to provide a multi-cell microscopic battery system with matrix of a cell elements supported on a common substrate.

It is also an object of the invention to provide a microscopic battery supported on a flexible conformable substrate.

It is further an object of the invention to provide a MEMS or integrated microcircuit with liquid components in the circuit.

An object of significance is to provide a process for the micro-forming of electrodes and a liquid electrolyte space in a microscopic battery by the selective application and removal of a sacrificial layer.

Yet another object of the invention is to provide microscopic batteries integrated into a micro-circuit and/or MEMS to form an autonomous system.

A further object of the invention is to provide microscopic batteries that may be connected to existing integrated circuits or MEMS, as a power source.

Yet an important object of the invention is to provide microscopic batteries that are rechargeable.

Another object of the invention is to provide microscopic batteries which comprise a liquid or a solid electrolyte.

It is also an object of the invention to provide new and modified microfabrication processes for the manufacture of microscopic batteries.

It is further an object of the invention to provide a process wherein microscopic batteries are manufactured photolithographically.

An object of significance is to provide various novel integrable and integrated microscopic battery configurations applicable to various power requirements in microcircuits.

Yet another object of the invention is to provide a thin film deposition and etching process for the manufacture of microscopic battery electrodes.

An object is the use of lithographic, thin-film processes to form microbatteries that are connected through microswitches that can be used to dynamically reconfigure a collection of microbattery cells in an arbitrary configuration of parallel and series cells or arbitrary connection to other MEMS components.

An object is the use of reconfigurable microbattery cells to match microbattery charging and/or discharging configurations.

Further objects of the invention will become evident in the description below.

BRIEF DESCRIPTION OF THE DRAWINGS

FIG. 3 is a profile of a further lithographically formed, thin film, aqueous electrolyte embodiment of the present invention, showing microscopic batteries arranged in series and in parallel;

FIG. 17 is a Rygone graph representation of the specific energy and specific power characteristics of various energy storage technologies;

FIG. 18 is a perspective with a part broken away for clarity, of a thin film microscopic battery cell, showing in particular a microscopic electrolyte cavity;

FIG. 19 is a perspective of a microscopic battery comprising a microscopic peg or pin electrode and a hollow receptor electrode;

DETAILED DESCRIPTION OF THE ILLUSTRATED EMBODIMENTS

Fabrication of Microscopic Batteries

Figure 1:
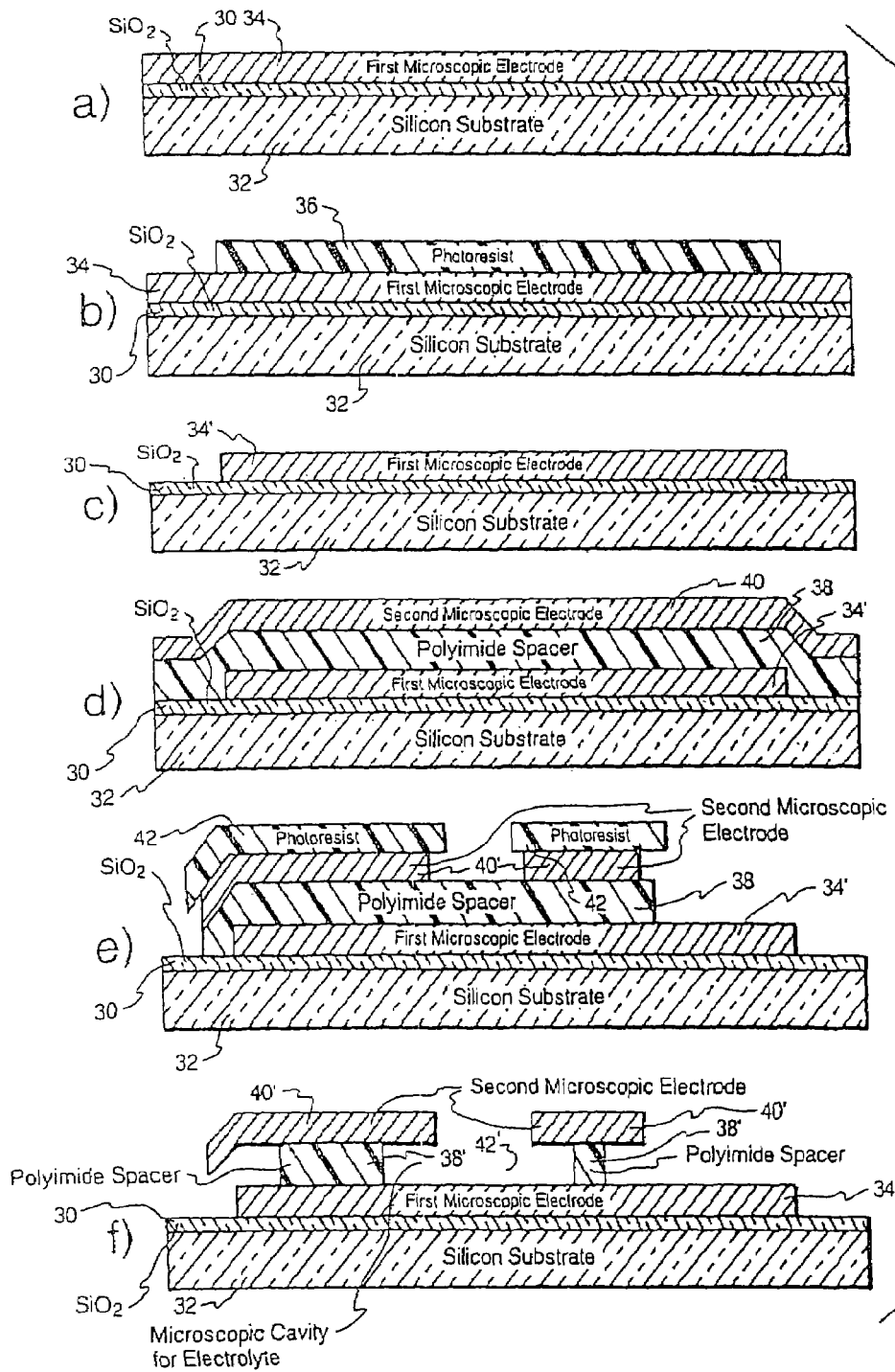
FIGS. 1a) through f) show in profile (cross section) thin film components fabricated during successive micro-fabricating steps, in accordance with principles of the present invention, by which a microscopic battery comprising thin film microscopic electrodes and a microscopic cavity comprising a receptor for a minute amount of aqueous electrolyte.

The microscopic batteries of the invention are fabricated using techniques parallel to those heretofore used in the formation of integrated circuits (IC) and MEMS (Microelectromechanical Systems), but novelly applied to the field of energy storage and delivery. The new processes are used to form the components of the microscopic battery, e.g., the microscopic electrodes, the storage of a microscopic amount of electrolyte in a cavity or space of microscopic size, an insulating or separator layer in some configurations, cell seals, etc. In general, these processes can be described as forming successive thin film patterned layers upon a substrate to obtain the desired microscopic battery configuration. A layer may be formed of a sacrificial substance which is chemically removed to form a microscopic cavity for electrolyte and/or expose a surface area of a microscopic electrode. The narrative below describes the application of the novel processes of this invention by which microscopic batteries of the present invention are formed.

In order for a microscopic battery to be optimal for internal inclusion in an integrated circuit, such as a MEMS, the batteries must be integrated with the circuit (either on a retrofit or original manufacture basis). The processes used to make microscopic batteries are intended for the most part to be compatible with those used to make components in the circuit, particularly where integration is obtained at the time of manufacture.

Processes applicable to the present invention can typically be described as the deposition of thin film layers in superimposed relationship on a dielectric or other suitable substrate, base or carrier (or over pre-formed layers) and lithographic formation of patterns in some or all of the layers. A microscopic cavity or reservoir for electrolyte may be selectively etched in a sacrificial layer. The composition and pattern of the layers depends upon its function.

Substrate

The batteries of the invention are presently most often formed upon a suitable substrate, either rigid or flexible (conformal). Commonly a silicon wafer is used as the base or substrate. Other suitable materials may be used, as will be apparent to those of skill in the art.

The substrate may be used not only as a base or carrier upon which a microscopic battery is formed but a base upon which other elements of the microcircuit are formed. Thus, a microcircuit with an internal integrated microscopic battery may be formed simultaneously or substantially simultaneously on a common base. Typically, the substrate is first be treated before formation of the microscopic battery to create an insulating or isolation layer. Parts of selected layers are removed to form a desired battery profile.

The substrate may be rigid where appropriate or formed of a conformable, yieldable or flexible material, usually of a-dielectric polymeric material. The flexible base may also be supported by a rigid temporary silicon substrate or other suitable material. A sacrificial layer, such as $SiO_2$, can be superimposed upon the rigid substrate, beneath the flexible substrate layer. The microscopic battery alone or with the microcircuit is fabricated on flexible substrate. The sacrificial layer is then etched away, freeing the flexible conformable substrate and the microscopic battery and other components mounted thereon from the rigid substrate for conformal mounting upon a non-planar surface.

Fabrication of the Electrodes

A battery comprises two electrodes separated by an electrolyte. The first battery component applied to the substrate is usually a deposition-created thin film microscopic electrode (cathode).

The microscopic cathode frequently comprises a thin film metal in an oxidized state. Such materials may be applied by a suitable deposition technique, such as evaporative sputtering, chemical vapor deposition (CVD), or electrodeposition. The cathode is typically a microscopic layer of metal which is modified by oxidation, diffusion, or ion-implantation. The cathode may be formed in a charged state or a discharged state, depending upon process considerations and the nature of the electrochemical couple of the battery. The cathode may be a metal oxide, such as nickel hydroxide, which, as such, may be precipitated onto a desired surface. While such is sometimes called "plating" better terms are electrodeposition and precipitation.

The microscopic anode is frequently a thin film metal or a metal hydride, and can be applied using any method for applying metal layers, such as sputtering, CVD, vapor deposition or electrodeposition. Zinc, when used as the active anode material, can be easily applied using available microfabrication techniques, and has the additional advantage of high operating potential when used in conjunction with many cathode materials. For example, zinc cells supply 1.65 V, with a nickel hydroxide cathode, vs. 1.3 V. for a metal hydride with a nickel hydroxide cathode. Multi-component microscopic anodes, such as metal hydrides, are more difficult to obtain by such techniques (sputtering, CVD, vapor deposition or electrodeposition), because of their multi-component composition and the need for a homogeneous thin film as the microscopic anode. However, they can be created by spin-coating a slurry containing powders of the appropriate composition.

The Electrolyte

The electrolyte has, as its key property, the ability to conduct ions, while restricting the movement of electronic current. The electrolyte used in these microscopic batteries may be any suitable material, the quantity of which is of a microscopic amount. The electrolyte may be an aqueous liquid disposed in a microscopic cavity fabricated between the microscopic electrodes, or an aqueous liquid disposed in a porous separator material between the microscopic electrodes. Aqueous liquid electrolyte systems are typically preferred where a higher power density is required. Novel techniques are available to fill an etched microscopic cavity with a miniquantity of electrolyte.

In one embodiment of the invention, a liquid electrolyte is contained in a microscopic electrolyte cavity. The microscopic cavity is formed by etching a polyimide layer underneath the anode through a hole in the anode layer. This same hole in the anode is used for filling the completed battery cell with a microscopic amount of aqueous liquid electrolyte. The liquid electrolyte may be delivered to the microscopic cavity of the battery using a syringe comprising a thin gauge medical-grade needle, which is positioned through the hole with the aid of a microscope, or in any other suitable way. The hole is thereafter sealed. Sealing may comprise filling and/or covering the hole with sealant or covering the entire cell.

In another embodiment a porous separator saturated with liquid electrolyte is used. The porous separator may obviate the need to form the electrolyte cavity. Cellulose, polymers (porous and/or nonporous) and/or fiberglass, each saturated with aqueous electrolyte may be used. Aqueous solutions of potassium hydroxide or sulfuric acid are frequently used as liquid electrolyte.

Solid microscopic electrolytes may, under some circumstances be used as part of the present invention, and have the advantage of not requiring a filling process. Solid electrolytes offer advantages of pliancy for conformal applications where required power levels are lower.

Fabrication of the Connectors

The microscopic batteries of the invention can be separately made and thereafter connected to other circuit components, for example on a retrofit basis, through use of suitable connectors. Microscopic wire bond, flip chip or TAB (tape automated bonding) connections are preferred, although and suitable technique available to those skilled in the art may be used.

The microscopic batteries of the invention may also be integrated (built unitarily and simultaneously) with an IC or MEMS, for example, to provide an autonomous system. Interconnection between the battery and the other components of the integrated circuit may be made by common thin film deposition, overlapping thin film deposition, wire bond, flip chip, TAB and/or in any other suitable way.

Seals

A minute amount of liquid electrolyte is sealed within the microscopic cavity or within the microscopic pores of a separator layer. The entire cell may be encapsulated by a suitable polymeric or other dielectric layer. Riston™ or polypropylene are examples of suitable sealants.

Choice of Electrochemical Couple

Battery couples and electrochemical couples are synonymous. Each refers to the basic chemistry of the cell. An electrochemical couple consists of two electrodes and an electrolyte. More commonly the name of the electrolyte is omitted when specifying a couple, such that the two electrode materials define the couple.

Many different kinds of electrochemical couples have been used. The lead acid battery uses the lead dioxide/sulfuric acid, water/lead couple. It is typically called the lead dioxide/lead couple, or the lead/acid couple. Another common electrochemical couple is the nickel/potassium hydroxide, water/cadmium couple, or the nickel/cadmium couple (i.e. $N_1$-Cad batteries). Others are nickel/zinc, silver oxide/zinc, lithium/ion, and zinc/air. Each couple has different electrode materials, and has different characteristics, such as cell voltage, power capability, cost, life, rechargeability, and so forth. The choice of the optimum couple depends on the application and other factors.

The electrochemical couple for the microscopic battery of the invention must have microscopic electrodes and a microscopic amount of electrolyte where formation is by microfabrication processes discussed herein. Ordinarily the selection of the electrochemical couple will determine the temperature range at which the microcircuit and battery need to be operated.

In most applications, microscopic batteries of the invention will be secondary (rechargeable) batteries, to accommodate a long useful life. However, primary microscopic batteries of the present invention may be fabricated for single use purposes, where recharging is not required. Circuits with secondary microscopic battery systems of this invention may include microcircuits and devices for recharging the secondary microscopic batteries. Solar cells, electromagnetic couples, and other suitable recharging devices may be used.

Rechargeable batteries are, of course, batteries which can be recharged following discharge. Non-rechargeable batteries cannot accept a charge following discharge, or at least can only do so with exceeding difficulty and possibly danger. The reasons that some batteries can be recharged and others cannot, are normally due to the internal chemistry of the cell, especially the electrode processes. During discharge, each electrode experiences chemical reactions, which involve the transfer of electrical charge. As a result of the reaction processes, reaction products are formed. These products are usually a different chemical compound. An example is the lead acid cell. During discharge, the following reactions occur:

Positive Electrode

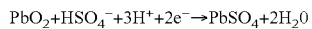
$$PbO_2 + HSO_4^- + 3H^+ + 2e^- \rightarrow PbSO_4 + 2H_2O$$

Negative Electrode

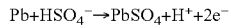
$$Pb + HSO_4^- \rightarrow PbSO_4 + H^+ + 2e^-$$

When electronic contact is made between the two electrodes (typically by placing a load across the cell), a flow of electrical charge (e⁻) occurs. Internal to the cell, the solid electrode reactants, $PbO_2$ and Pb, combine with the sulfuric acid, and, form the discharge products, $PbSO_4$ (note: in the case of the lead acid cell, the discharge product is the same for both electrodes. In general, this is not the case, however.). The lead acid cell is rechargeable. The recharge reactions are the reverse of the discharge reactions:

Positive Electrode

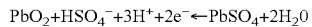
$$PbO_2 + HSO_4^- + 3H^+ + 2e^- \leftarrow PbSO_4 + 2H_2O$$

Negative Electrode

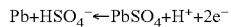
$$Pb + HSO_4^- \leftarrow PbSO_4 + H^+ + 2e^-$$

In a rechargeable battery, the electrode reactions can proceed back and forth, in either direction. In other words, the cell is reversible. In a non-rechargeable battery, this is not the case. Electrode reactions are not easily reversible, if at all. Attempts to do so can result in excessive cell heating or explosion. Another name for rechargeable batteries is secondary batteries. Another name for non-rechargeable batteries is primary batteries.

There is a large number of materials available for inclusion in electrochemical couple for microscopic batteries according to the present invention. By way of example only, microscopic electrochemical couples of the present invention may comprise, among other things microscopic electrodes formed of nickel, zinc, metal hydride, lead, lithium, silver, copper, platinum, carbon, cadmium and lanthanum, and derivatives thereof, combined into pairs of microscopic electrodes in a manner known in the art, and electrolyte, solid or liquid, in microscopic quantities formed of aqueous potassium hydroxide, aqueous sulfuric acid, lithium glass, an ion-conducting polymer, a polymer containing an ionically-conductive material, or a porous separator saturated with a suitable liquid electrolyte, as is known in the art. The porous separator may be of porous spun polymer, cellulose or a pervious fiberglass. A non-porous separator may be used where electrolyte is otherwise interposed between microscopic electrodes.

Among the preferred couples for the invention are nickel/metal hydride and nickel/zinc. Others are lead acid, .lead/zinc, nickel/cadmium, silver/zinc and lithium/carbon. Both couples are well-known as secondary couples using an aqueous electrolyte usually potassium hydroxide or sulfuric acid. Typical operating voltages (1.0-1.3 V for nickel/metal hydride, and 1.3-1.6 V for nickel/zinc) are suitable for MEMS applications. It is of importance that the invention accommodate connection of cells in parallel and in series to provide a satisfactory range of output voltages. The nickel hydroxide electrode is an excellent cathode for applications requiring long cycle life. This electrode has several advantages, e.g. it is suitable for at least moderate rates of discharge and it is dimensionally stable and can be used with a variety of different anodic materials. It can also be made in both the charged and discharged states.

Zinc anodes are attractive because of their low equivalent weight, high reactivity, and good electronegativity. Sometimes zinc secondary batteries fail due to zinc dendrite formation and redistribution of the zinc during cycling. Such is less likely to occur with the present microscopic batteries due to the small dimensions and the simplified microscopic cell geometry. The metal hydride anode has the advantages of dimensional stability and reasonable good cycle life. Its past disadvantages are high self-discharge rate and modest electronegativity.

Silver/zinc cells are suitable using liquid in porous materials for the electrolyte. The porous materials may comprise spun polymers containing an electrolyte (5 M $KOH/H_2O$). This type of cell may have a lower cycle life (number of charge/discharge cycles) due to silver migration to the negative electrode. The use of cellulose as a separator would enhance cycle life, but may pose fabrication difficulties.

Lead dioxide/zinc cells are also suitable, but may have a low cycle life due to the very high solubility of zinc in acid electrolytes.

Nickel/cadmium cells perform comparably to nickel/metal/hydride cells. However, this electrochemical couple may present some problems because of cadmium toxicity and the possibility of cadmium contamination of fabrication equipment and other fabrication problems.

Lead acid cells are capable of good cycle life and excellent power output. The lead acid cells may be thermodynamically unstable because of the thin film nature of the lead dioxide electrode, which may retain a charge. Lead acid microscopic batteries can deliver a power discharge per cell of on the order of 10 $W/cm^2$ for short (ms) discharge times. The power discharge rate per cell decreases to 1 $W/cm^2$, 0.1 $W/cm^2$ and 0.01 $W/cm^2$ for discharge times in seconds, minutes and hours respectively.

Nickel/zinc microscopic batteries have maximum power discharge rates of 1 $W/cm^2$, while cells with solid electrolyte ha e much lower maximum power discharge rates, e.g. 0.01 $W/cm^2$.

A good metal hydride material which is useful in batteries, is one which can accept, store, and release hydrogen within its structure. In order to do this, both the composition and structure of the metal are important.

A metal mixture used as a hydride is prepared such that the composition (the relative amounts of the various constituents, such as nickel and lanthanum) is proper. The metal when it is deposited consists largely of two distinct phases: nickel metal, and lanthanum metal. Mixing of the two is normally not adequate. However, if the deposited material is heated to a proper elevated temperature, then the mobility of the metal atoms increases, and the lanthanum and nickel migrate and mix with one another. Thus, heating improves mixing of the two metals. Heating can also cause the metal, structure to re-organize itself into other crystal structures. Some crystal structures are better than others with respect to hydrogen acceptance.

Characteristics of Microscopic Batteries

With some variation, microscopic batteries according to the present invention typically comprise the following characteristics:

| Characteristic | Lower Limit | Upper Limit |
|---|---|---|
| A. Voltage | | |
| open circuit (i.e. w/o load) | 1.0 V | 4.0 V |
| during operation | 0.0 V | 3.5 V |
| B. Current | 0 (no load) | 100 mA |
| C. Discharge Power Output | 0 (no load) | 10 W |
| Recharge Power Input: | 0 | 1 W |
| Energy Storage | 0.00005 Joules | 4 Joules |
| Charge/Discharge Cycles | 0 (One Discharge) | Millions (limit unknown) |
| Operating Temperatures | −40° C. | 80° C. |
| Discharging Time: | 0.001 seconds | Days - Months |
| Recharge Time: | 0.1 seconds | Days - Months |
| D. Internal energy losses: | $10^{-8}$ W | 10 W |
| E. Current Density | 0 (Open Circuit) 1 $\mu A/cm^2$ (Load) | 10 $A/cm^2$ |
| F. Inter-electrode gap | 1 $\mu m$ | 100 $\mu m$ |
| G. Coulombic Capacity | 0.000025 C | 1 C (Coulomb) |

Typical specific energy and specific power characteristics are show in dotted lines in the graph of FIG. 17. The features of merits shown in FIG. 17, specific power and specific energy are the most relevant and common features of merit for traditional batteries. It is most desirable to maximize energy, storage per unit mass, or power per unit mass. It is also common to assess energy storage and power per unit volume. In other words, it is important to minimize the mass and/or volume of the battery.

In integrated circuits, mass and volume are relatively unimportant, but the area of the battery (the amount of the surface on the circuit or chip) is very important. As such, a more useful feature of merit is energy per area ($J/cm^2$, or $W \cdot hr/cm^2$), and power per area ($W/cm^2$). The graph of FIG. 17 is useful for relative comparisons between different energy storage concepts.

Method of Integration

A microscopic battery of the present invention may be integrated with a MEMS or other integrated circuit by concurrent, simultaneous or unitary formation of both upon a silicon substrate wafer, or other suitable base. For example, methods for fabrication of flexible, thin-film interconnections used in multi-chip packaging and methods involving lithographic, sacrificial release and etching may be used which parallel the fabrication of MEMS. These processes provide for integration of the microscopic battery into an integrated, interconnected microcircuit system, which is required for autonomous applications. The support base may be flexible and may comprise a flexible sensing surface.

Several microscopic batteries or microscopic cells of the invention may also be integrated, interconnected, arranged and combined to provide a power system from which different voltage outputs are available. This allows for matching of the voltage for the electronic and MEMS components, which often require different voltages for optimum performance. The systems may comprise electronic reconfigurating components, i.e., switching devices, for example, to change or reconfigurate the combination of cells to achieve a different or changed set of output voltages. More specifically this allows, for example, a power system to produce different voltages, as selected manually or by programing, or to permit a high voltage output, with a low voltage recharging circuit.

Battery Configurations

Figure 2:
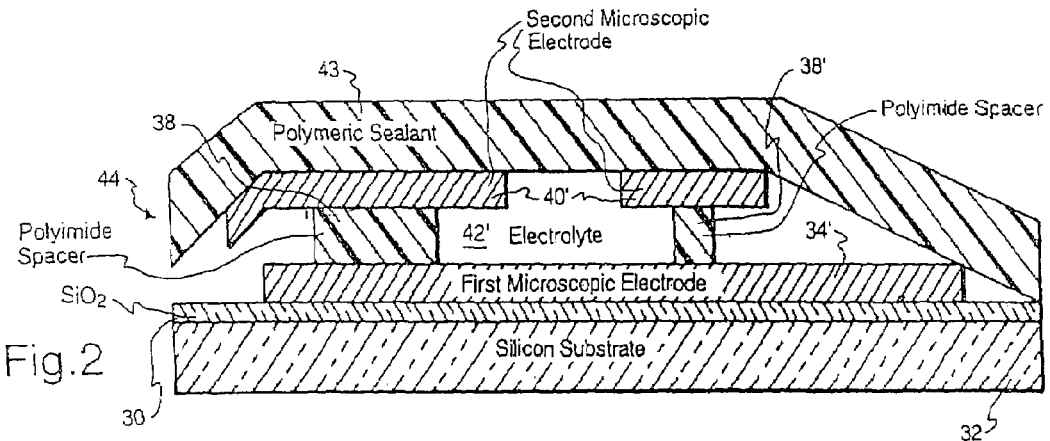
FIG. 2 is a profile of a completed single cell, lithographically formed, thin film aqueous electrolyte microscopic battery comprising one form of the present invention.
Figure 11:
FIG. 11 is a schematic of a flat cell microscopic battery according to the present invention.

A flat cell microscopic battery configuration, of the type shown in FIGS. 2 and 11, is the simplest approach from a fabrication standpoint. The flat cell 60 is arranged somewhat like a sandwich, i.e. a set of superimposed layers with two ultra thin space electrodes on either side of a microscopic space containing electrolyte. See FIG. 2, for example.

Figure 13:
FIG. 13 is a schematic of a parallel wires conformal microscopic battery according to the present invention.

A variation of the flat cell is a linear cell 62. See FIG. 13. The materials used for each electrode are thin film deposited adjacent to but spaced from one another in parallel lines. Electrolyte is placed between and around the two lines of electrode material. The result is a wire-shaped micro battery. The region on an integrated-circuit board or the like intended to be devoted to a wire can be replaced by the wire-shaped battery. Connections are made to either end of the cell (at the opposite electrodes). Such cells need not be straight, but can conform to any desired shape.

Other configurations are also embraced by the invention, which use the same or similar fabrication procedures. Each has advantages with respect to capacity, current output, voltage, convenience and/or cost effective manufacture. The present invention accommodates an embodiment comprising a bipolar stack which is normally best for high voltage. The bipolar stack may be made by superimposing several single flat cells 60 one on top of the next, which provides high-voltage availability from a small area on a substrate. The bipolar configuration may have a lower capacity when compared with other configurations.

Figure 12:
FIG. 12 is a schematic of a plurality of flat cells connected in series comprising a microscopic battery system according to the present invention.

Another way of achieving high voltage is to connect several flat cells 60 in series with connecting wires interposed between the electrodes of successive cells. See FIG. 12. This configuration is simple, but uses a large substrate area and also may have a low capacity.

Figure 15:
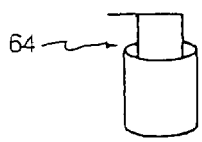
FIG. 15 is a schematic of a wire-in-the can microscopic battery configuration according to the present invention.

A high capacity configuration is a "wire-in-can" arrangement 64. See FIG. 15. This configuration may be difficult to fabricate. A small cylindrical container is made from the anodic metal, such as zinc. A wire or thin plate is made from suitable cathodic material and placed into the anodic can, in spaced or separated relationship, along with electrolyte. The cell is then sealed.

Figure 14:
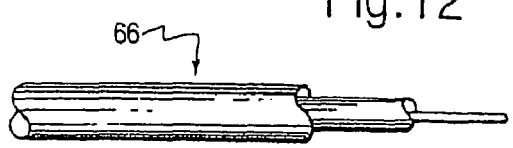
FIG. 14 is a schematic of a concentric tubular configuration of a microscopic battery according to the present invention.

Another configuration is the concentric wire arrangement 66, which has the advantages of being flexible and conformable, as well as being of simple construction. See FIG. 14. This configuration is made by using a wire made from a metal anodic material (such as zinc), coating the wire with electrolyte (with or without a porous separator), and concentrically surrounding the electrolyte and wire with tubular-shaped cathode material. This type of cell is extrudable and its pliancy accommodates conformability into almost any shape. Attachment of the cell to a substrate, base or the like would not require attachment to the base at several points, but the cell can be attached at one end so as to extend perpendicular to the base or substrate. This conformal wire-shaped configuration typically comprises a diameter within the range of 50 to 1000 microns or less, but may comprise a length of several centimeters. Long rolls of wire microscopic battery 66 can be made and wound upon a spool. The spool can be rotated to remove a desired length of battery 66, which is cut and integrated with a-desired circuit, where the length is a function of the amount of energy storage required.

Figure 16:
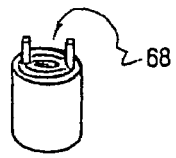
FIG. 16 is a schematic of a spirally-wound microscopic battery according to the present invention.

Another high-capacity configuration is the spirally-wound configuration 68, which also occupies only a small area on the substrate or base. See FIG. 16. Thin, flat ribbons of opposing thin film electrode materials are superimposed on top of one another with a thin separator layer between them and an additional separator layer placed on top. The thin electrodes comprise a conductive tab or connector. The combination is then rolled into a spiral and placed in a cylindrical container. After containment, the spiral is filled with electrolyte, the container is sealed and the completed microscopic battery is positioned on the substrate.

Figure 8:
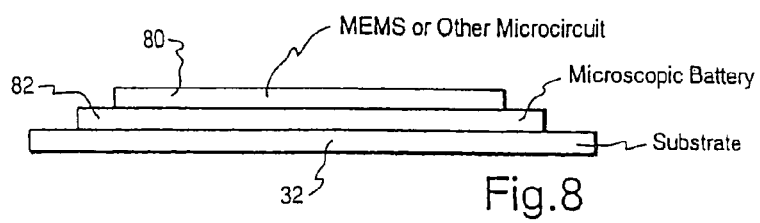
FIGS. 8 and 9 are diagrammatic representations showing two stacking arrangements for a microscopic battery and a MEMS or other microcircuit.
Figure 9:
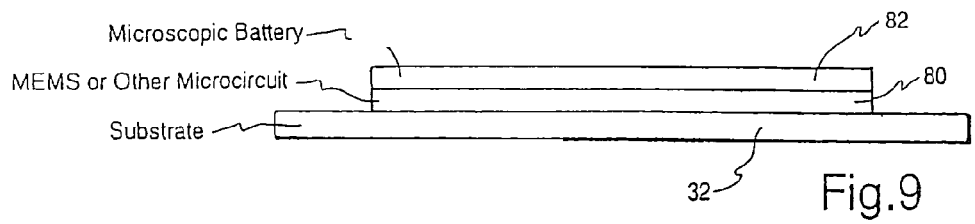

As shown in FIG. 8, a MEMS or other microcircuit 80 may be stacked upon a substrate-mounted microscopic battery 82 of this invention. The reverse arrangement is shown in FIG. 9.

Figure 7:
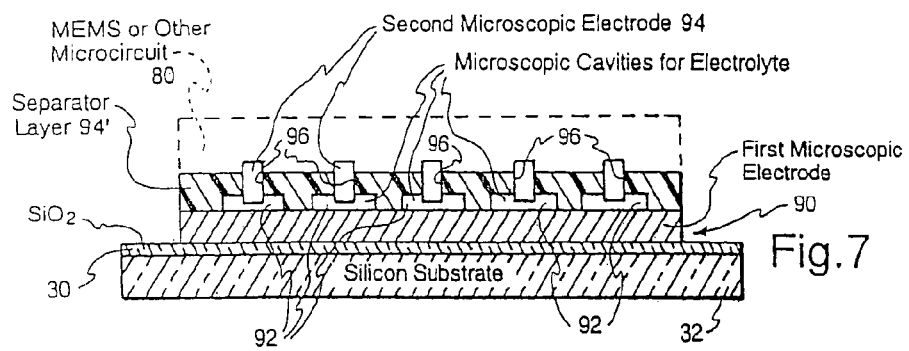
FIG. 7 is a profile of a further embodiment of the present invention which comprises a support comprising a rigid substrate coated with silicon dioxide, a first thin film microscopic electrode, a plurality of microscopic cavities formed in a separator layer for aqueous electrolyte and a plurality of second electrodes in the form of microscopic rods or pins, one for each cavity.

FIG. 7 depicts the stock arrangement of FIG. 8, but with a somewhat different microscopic battery 90. Microscopic battery 90 is of thin film construction and comprises a support comprising rigid substrate 32 coated with silicon dioxide 30, first thin film microscopic electrode 34', a plurality of microscopic cavities 92 formed in a separator layer 94, in which aqueous electrolyte is contained, and a plurality of second electrodes in the form of microscopic rods or pins 94, one for each cavity 92. Each pin 94 is secured in an aperture or bore 96, which may be formed by drilling or in any other suitable way. MEMS or other microcircuit 80 is shown as superimposed upon battery 90.

Description of Processes

The methodology of the invention involves micro-fabrication techniques parallel to those used to form integrated circuits generally, and MEMS in particular. Heretofore conventional wisdom has dictated use of large external power sources for MEMS and other microcircuits. Microcircuits with integrated or internal microscopic batteries have been viewed as not viable. Micro-fabrication techniques have not heretofore been employed in an attempt to invent or provide a cost effective microscopic battery for internal microcircuit purposes. The micro-fabrication techniques used in the manufacture of microscopic batteries of the invention are to a large extent adaptations from IC fabrication techniques.

Fabrication of microscopic battery components involves the lithographic application of superimposed layers carried by a substrate. Layer deposition techniques include Chemical Vapor Deposition (CVD), evaporation or vapor deposition, sputtering, spin coating and electrodeposition. CVD is generally known for the application of silicon, silicon oxide, refractory ceramic compounds (e.g. $Si_3N_4$), and refractory metals and metal oxides. CVD involves the thermal decomposition and/or reaction of gaseous compounds to form thin films upon a surface. For the present invention, CVD is used for deposition of one or both thin film electrodes (anode or cathode) of the microscopic battery.

Evaporation or vapor deposition involves the heating of a metal to form a vapor and then redeposition of the metal vapor to form a thin metallic film upon a desired surface. Evaporation can be used in microscopic battery construction for the fabrication of the microscopic thin film electrodes.

Sputtering is achieved by bombarding a target with energetic ions, typically $Ar^+$, and knocking loose atoms from the surface of the target, which atoms are transported and deposited upon a substrate. Sputtering can be used in microscopic battery construction for the fabrication of metal and metal oxide thin film electrodes.

Spin coating is accomplished by spinning a substrate in the plane of its surface and applying a liquid coating material, which is spread evenly over the surface by centrifugal force. Spin coating of a suitable polymeric material over a thin film electrode creates battery separators or spacers, which are insulating layers, dielectric spacers and passivating layers. A porous polymeric layer may be created by spin coating between the electrodes and thereafter saturating the porous polymeric layer with liquid electrolyte. A completed microscopic battery or microscopic battery cell can be externally coated or sealed using spin coating procedures. Spin coating is an important step in the lithographic patterning process used to custom etch electrodes into the desired shape and to remove a specific part of a polymeric coating or layer to create a microscopic cavity for liquid electrolyte, for example. In one form, a polyimide layer may be used so that selective removal of a portion thereof creates an electrolyte cavity. Spin coating may also used for application of certain electrode materials where the electrode materials are supplied as a slurry and the slurry stabilized by photolithographic techniques to form thin electrode layers. For example, a metal hydride powder may be slurried with an appropriate liquid and then spin coated.

Electrodeposition is a process heretofore applied to microfabrication of IC and MEMS, but not to making microscopic batteries. This process involves application of a conductive film, such as a metal, to create a first thin film microscopic electrode on a substrate and, thereafter, immersing the coated substrate in a current-driven electrodeposition solution to form a thin film microscopic counter electrode of suitable composition in spaced relation to the first electrode. This process may be used in the present invention for the deposition of electrodes, such as nickel oxide electrodes, for example, $PbO_2$ and AgO cathodes may also be formed by electrodeposition.

Patterning is the shaping or configuring of layers by masking portions to be retained and removal of undesired portions to customize various structures or shapes within the microscopic battery cell. This can involve the selective application of layers and removal of predetermined segments of a selected layer, or the masking of the substrate by a sacrificial masking layer, followed by applying the next layer and etching to remove the mask. Lithographic processes, including but not limited to photolithography, are applied in a known manner consistent with the microscopic battery to be formed; therefore, the processing is a modification, adaption and/or variation of prior non-battery technologies.

After the thin film layers are applied and before or after they are shaped by patterning, they may be modified by any of various processes. These include the chemical modification of the layer, using oxidation, diffusion, and ion-implantation techniques. These processes are used in conjunction with lithography to modify only selected parts of patterned portions of the layer being treated, or to mask other layers.

Etching is used for the removal of undesired parts, usually by chemical reaction, and is often used in conjunction with lithography to pattern a layer or protect other layers. The method of etching and the etchant composition depend on the material to be removed. These include, by way of examples only, hydrofluoric acid for silicon dioxide materials, wet acid etching for suitable metal oxides and metals, oxygen plasma etching for polymeric or other organic materials. Etching is used here in conjunction with other processing techniques to apply surface micro-machining techniques to microscopic battery construction. Etching of a part of a layer can be used to form a cavity for a liquid electrolyte.

The above-described micro fabrication steps lend themselves well to mass production, which produces low costs of manufacture and low rejection rates.

EXAMPLE I

Fabrication of Zinc/Nickel Hydroxide Microscopic Batteries with Aqueous Liquid Electrolyte Small area, thin film nickel/zinc aqueous microscopic batteries of the invention with a footprint of 350 µm by 350 µm were built and tested. The batteries utilized a 5M KOH/$H_2O$ electrolyte.

The cathode was made as an ultra thin, continuous film of nickel hydroxide, without large crystals or rough deposits. Voids in the film were avoided. The film adhered to its current collector (in this case, a thin nickel film on a silicon wafer). The thickness of this layer was about 1-5 µm. The nickel hydroxide was electrodeposited from an aqueous solution of 0.1 M $Ni(NO_3)_2$. The substrate was a four-inch silicon wafer with a thin nickel film vapor deposited on one face. A thin film nickel counter electrode was used. The two electrodes were held apart (2.5 cm spacing), and a cathodic current of 50 mA was used for deposition. In order to prevent the vapor-deposited nickel film from detaching from the silicon wafer, a layer of titanium was first vapor-deposited on the silicon wafer before vapor deposition of the nickel film, and the combination was annealed. Particulate matter, especially nickel hydroxide, was excluded from the solution to avoid formation of large particles. Filtering the deposition solution reduced the number of large particles formed and improves adhesion. For optimal performance, the films of nickel hydroxide are made thin and homogeneous in composition.

The nickel film was then electrochemically oxidized (in aqueous KOH solution) to form NiOOH for microscopic cells fabricated in the charged state. The resulting ultra thin layers may be approximately 5 µm thick and have a capacity of >0.2 $C/cm^2$.

The zinc anode electrodes were made by evaporation of zinc metal onto the targeted surface.

FIGS. 1a-f are profile schematics illustrative of the lithographic steps by which a thin film, aqueous electrolyte, small area microscopic battery of the invention may be formed. The profiles are illustrated from the vantage point of a cleaved cross section of the thin film layers being applied and configured at various times during the process. The scale for the x- and y-directions is not the same in order to better illustrate the layers with clarity.

The process illustrated in FIGS. 1a-f began, for example, by growing a global, thermal $SiO_2$ layer 30 on the top of the silicon substrate or base 32. The $SiO_2$ layer, in the alternative, may be CVD deposited and is capable of being etched when and to the extent appropriate. Oxide growth was followed by deposition of the NiOOH cathode material 34 as described above. See FIG. 1a. A photoresist layer 36 was then spin-deposited on the wafer and sized or patterned as shown in FIG. 1b. Areas of the photoresist layer 36 were exposed to carefully focused light, which effects a change in the structure of the resist layer thus exposed, allowing for its easy removal (while leaving the rest of the resist in place). Then, metal can be deposited only in the areas not covered by the resist. Finally, the remainder of the resist is removed at the appropriate time. The patterned photoresist was thus used as a conformal mask for a wet metal etch, which reduced and thereby defined the peripheral dimensions of the bottom electrode 34' and provided for ample separation between individual microbattery cells, where more than one cell was formed. See FIG. 1c.

A 10 µm layer 38 of Dupont 2611D polyimide (other suitable material may be used including silicon dioxide) was spin-deposited on the top and edges of the bottom electrode 34' and along the exposed part of the top surface of $SiO_2$ layer 30. The polyimide layer 38 was fully cured by using a 400° C. anneal in a nitrogen atmosphere.

After the polyimide cure, a thin film microscopic layer 40 of zinc was evaporated onto the top surface of the layer 38. FIG. 1d represents the wafer profile at this point in the process. A photoresist layer 42 was spin-deposited over the top of all layers superimposed upon the wafer 32 and patterned to both separate cells and to create a fill hole etch mask in the zinc layer. The photoresist pattern was then used as a mask in conjunction with the wet etch patterning of the zinc electrode layer, to produce the contoured configuration shown in FIG. 1e.

Following patterning of the zinc layer 40 to configure the second microscopic electrode 40' into the desired shape, the polyimide layer 38 underneath the zinc layer was etched in an oxygen plasma to create the polyimide spacers 38' shown in FIG. 1f. The transformation of polyimide layer 38 into spacers 38' also created a microscopic cavity 42 into which a microscopic amount of aqueous electrolyte was later placed.

The size and characteristics of the etched electrolyte cavity were visually verified with a test wafer. A separate test wafer was processed identically to the microscopic batter; wafer, except that the zinc electrode layer was replaced with a transparent $SO_X$ layer. This transparent layer allowed visual inspection of the electrolyte cavity. The microscopic battery and test wafers were processed simultaneously, under the same conditions, and the test wafer was, therefore, a replica used to accurately predict the size of the electrolyte cavity. FIG. 18 is a perspective of a microscopic cell showing the underlying NiOOH microscopic electrode layer 34' and the microscopic electrolyte cavity 42 in the polyimide layer 38'.

After formation of the microscopic electrolyte cavity 42, the cell was filled with KOH/$H_2O$ through aperture 46 (FIG. 18), using a surgical needle mounted on a micromanipulator (used on a sub-micron probe station). The aperture 46 had a diameter of about 300 µm. Other suitable ways for placing electrolyte in the microscopic cavity 42 may be used. After filling the cavity 42, the hole 46 and/or the entire cell can be sealed using a suitable material, such as Riston™ or vapor deposited Parylene.

A polyimide sealant 43.was next deposited over the top of the microscopic assemblage of FIG. 1f for form the completed microscopic cell or battery 44 shown in FIG. 2. Other suitable sealants may be used.

The microscopic battery of FIG. 18 comprised a footprint approximately 750 µm by 750 µm with an adjoining tab for electrical connection. Other microscopic cells with side dimensions or footprints of 250 µm and 500 µm have also been fabricated. Similar cells with other configurations have been built.

A microscopic battery was fabricated and tested. The cell was built in the charged state with electrodes 34' and 40' of metallic zinc and NiOOH with a separator 38' interposed between. The initial open circuit potential was approximately one volt. It is believed that the fabrication procedure may have influenced the condition of the electrodes, particular, the etching of the electrolyte cavity may have changed the nature of the electrode surfaces. The cell further comprised an etched electrolyte cavity 42 and a micro-aperture 46. Etching of the cavity can be through the aperture 46. Aqueous electrolyte was deposited into the cavity 42 through the aperture 46. The cell was charged and discharged 13 times at current densities ranging from 0.2 to 5.1 mA/cm² based on the approximate area of the NiOOH electrode. The current densities were approximated based upon the estimated extent of undercut of the electrolyte cavity. These results represent the first set of current/voltage data taken from a truly microscopic battery with an active area less than 0.001 cm².

Batteries of this invention may be described as comprising "features," i.e. a first microscopic electrode, a second microscopic electrode and a space or spaces in which electrolyte is placed between the electrodes (with or without an ultra thin separator). Batteries according to the present invention may comprise a feature as small as ½ of one micron.

EXAMPLE II

Fabrication of a Metal-Hydride/Nickel Hydroxide Microscopic Battery with Liquid Electrolyte A microbattery was constructed, essentially as in Example I, except that the anode comprised a metal hydride instead of zinc metal. For the metal-hydride anode electrodes, a two component hydride of lanthanum/nickel alloy was used. This electrode was constructed in the discharged state (i.e., not loaded with hydrogen). Thin films of La—Ni were formed by evaporating from a La—Ni melt. The composition and temperature of the La—Ni melt was carefully controlled. Also, the metal was alloyed after deposition to ensure that the hydride had the best structure for hydrogen insertion.

Example III

Fabrication of Zinc/Nickel Hydroxide Microscopic Battery with Liquid Electrolyte in Porous Spacer A zinc/nickel hydroxide microbattery was constructed. The cathode is formed essentially as in Example I by forming an oxide layer and thereafter a NiOOH cathode. After patterning of the cathode, a layer of porous material for the electrolyte is formed.

EXAMPLE IV

Fabrication of Solid Electrolyte Microscopic Battery

Microscopic batteries with a solid-state electrolyte were made. Despite their lower power performance relative to liquid electrolyte batteries, solid electrolyte batteries are attractive for applications which require, for example, batteries to bend or conform to a particular shape, or to operate over a broad range of temperatures.

Two different solid electrolyte materials were used, i.e. tetramethylammonium hydroxide pentahydrate (TMAOH) and polyethylene oxide/potassium hydroxide (PEO/KOH). TMAOH is a solid electrolyte material used heretofore in a solid-state Ni/MH battery which can provide current densities of 10 mA/cm². PEO, widely used in solid state cells, is a polymer to which a salt can be added to produce a finite ionic conductivity.

EXAMPLE V

Fabrication of Flat-Cell Chain Microbattery and Construction of an Array

Numerous microscopic nickel/zinc cells were made on a single substrate. Six cells were connected in parallel by appropriately attaching microscopic wires. These cells were then charged and discharged together, and suffered no appreciable capacity loss through over 250 charge/discharge cycles. Specific capacity (C/cm²) of the parallel-connected bank of cells was essentially the same as that of a single cell being discharged by itself.

EXAMPLE VI

Fabrication of Wire in can Microbattery

A "wire in a can" cell was made comprising a high surface area porous nickel thin film first electrode, wrapped in a thin porous separator and placed inside a cylindrical container comprising a thin film of zinc at the inside surface and containing an electrolyte comprising 5 M KOH/H₂O.

EXAMPLE VII

Fabrication of Concentric Wires Microbattery

A hole was create down the axis of a zinc wire. A nickel wire was thinly coated with nickel hydroxide material, and then by a thin separator soaked in KOH/H2O. This wire, thus coated, was then inserted into the zinc wire. The open circuit potential of the cell was 1.65 V, which is expected from zinc/nickel cells. The cell was operated through numerous charge/discharge cycles without significant loss of capacity.

The concentric wires microbattery may be considered a "long" version of the wire in a can cell (i.e. a very long can). The concentric wire battery lends itself well to mass-productive methods, such as extrusion.

The Embodiments of FIGS. 3-6

FIG. 3 illustrates a plurality of microscopic cells or batteries 44; formed unitarily and simultaneously in the manner described above. The parts of the battery or cell 44 of FIG. 2 are identically numbered in FIG. 3. The part identified prime numerals of FIG. 3 are substantially similar to the parts of FIG. 2 so enumerated. The microscopic cells 44' at the left and in the center are interconnected in parallel, the two sharing a common first microscopic electrode 34.'" The common first thin film microscopic electrode 34" and the first thin film microscopic electrode 34" are in electrical communication with a thin film first level interconnect 46. The right microscopic cell 44' is in series with the other cell 44.' A second level interconnect 47 is in electrical communication with the second microscopic thin film 40." Note that electrical interconnections in FIG. 3 comprise thin film or ribbon interconnection. Connections between one or more microscopic batteries or cells of the present invention and a MEMS or non-MEMS integrated circuit can likewise be thin film or ribbon connectors.

Various arrangements and combinations of microscopic battery cells comprising single cells, cells in parallel and cells in series are embraced by the present invention. One of these arrangements is show in FIG. 10, wherein some of the cells 44 are connected anode to cathode and by which several output voltages are available.

Figure 4:
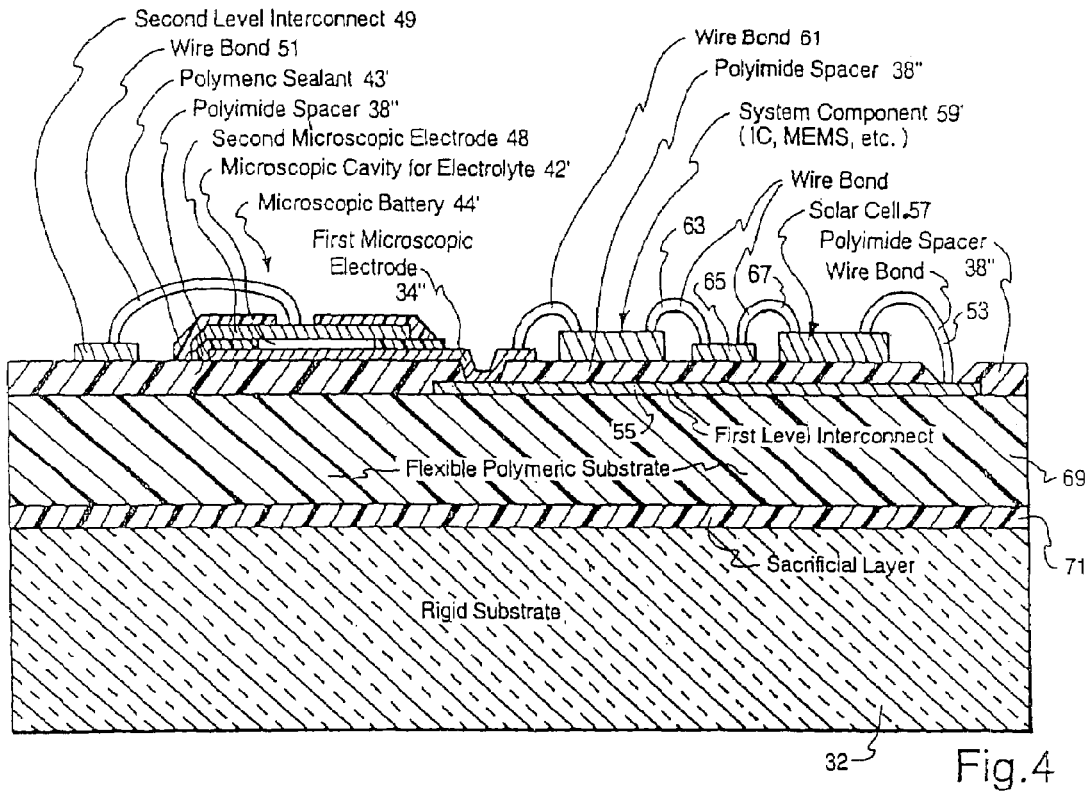
FIG. 4 is a profile of a lithographically formed thin film embodiment of the invention integrated with a MEMS or non-MEMS microcircuit and including digital/RF capability, the microscopic battery being rechargeable by a solar cell and all components being carried on a flexible substrate which can be removed from the rigid substrate by destruction of a sacrificial layer, to accommodate placement on a non-flat surface.

FIG. 4 illustrates a further combination according to the present invention, which comprises one microscopic battery 44', of the type described in conjunction with FIG. 1a through 1f and 2 with modest variations. Microscopic battery 44 of FIG. 4 is illustrated as comprising a wire bond 51 connection between the second microscopic thin film electrode 48 and a second level interconnect 49, and a wire bond 53 connection between a first level interconnect 55 and a battery recharging solar cell 57. The first microscopic thin film electrode 34" is in electrical communication with both the first level interconnect 55 and an IC or MEMS circuit 59 (via wire bond 61). The circuit 59 is connected to the solar cell 57 via wire bond 63, conductor 65 and wire bond 67.

All of the micro components identified above in conjunction with FIG. 4 are stably carried on a flexible polymeric substrate 69 from which the underlying sacrificial layer 71 is entirely etched to accommodate placement (mounting) of the flexible polymeric substrate and the superimposed micro components in conforming relation upon a non-linear surface.

Figure 5:
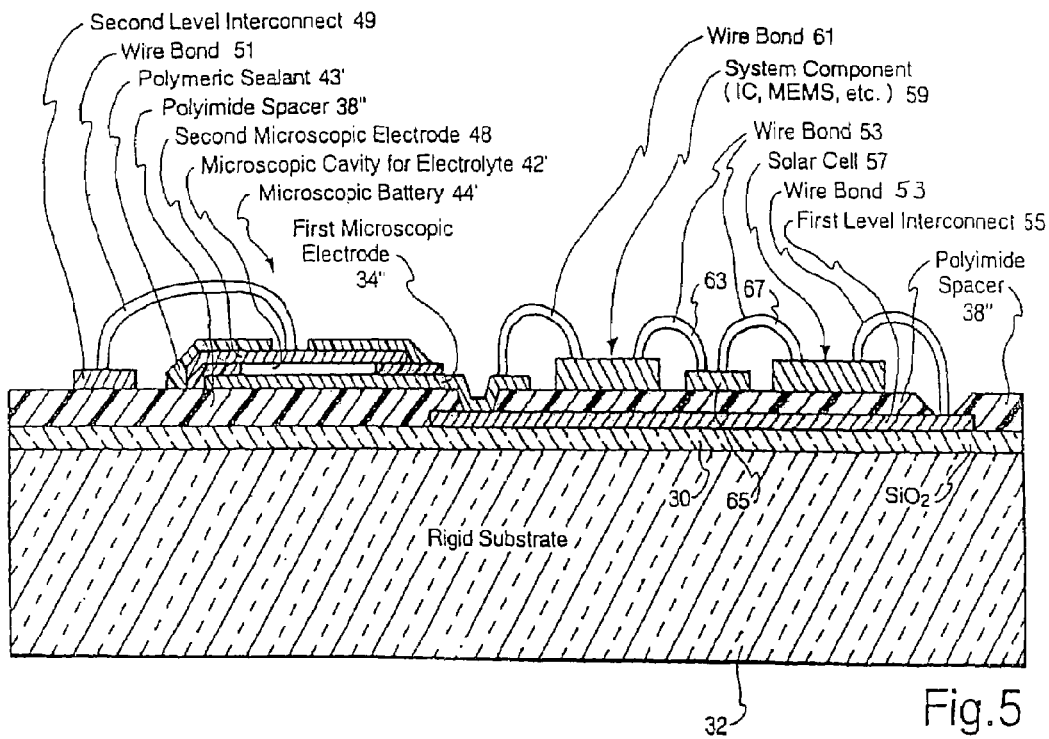
FIG. 5 is a profile substantially similar to FIG. 4, except the microscopic battery, the system, including digital/RF capability, and the solar cell are permanently mounted on a rigid base or substrate, as opposed to a rigid base or substrate.

The integrated circuit/microscopic battery arrangement of FIG. 5 is identical to the heretofore described integrated circuit/microscopic battery arrangement of FIG. 4, and has been correspondingly enumerated. However, the mounting of the FIG. 5 arrangement differs from mounting of FIG. 4. Specifically the integrated circuit/microscopic battery arrangement of FIG. 5 is mounted upon $SiO_2$ layer 30, which in turn is superimposed upon rigid silicon substrate 32.

Figure 6:
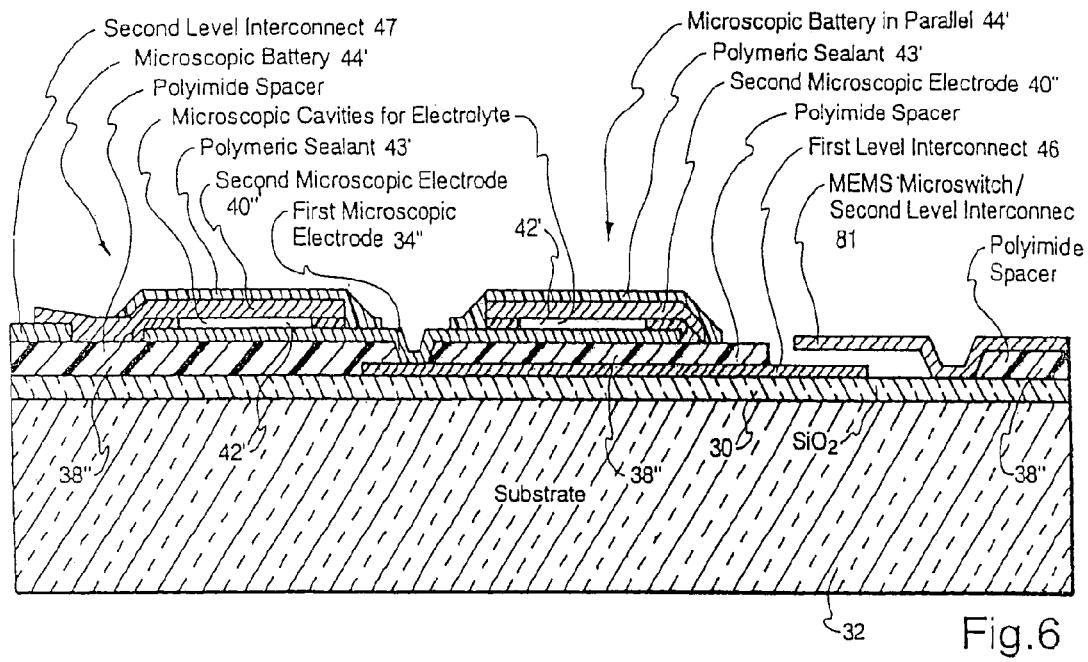
FIG. 6 is a profile of another lithographically formed thin film embodiment of the present invention comprising a MEMS microswitch/second level interconnect by which the microscopic cells or batteries of the system can be dynamically reconfigured for charging and discharging.

The left and central portions of FIG. 6 are essentially the same as the left and portions of FIG. 3, and have been correspondingly enumerated. The right portion of FIG. 6 is different. Specifically, the right side of FIG. 6 comprises a MEMS microswitch/second level interconnect 81, show in an open condition. When closed, switch 81 is placed in electrical communication with the common first thin film microscopic electrode 34" across interconnect 46. Microswitch 81 responds to an eternally-applied electrical impulse, and either open or shut a circuit. It is used to re-configure an array of cells in a variety of ways. For example, a string of cells can be connected in series, when switches 81 placed between them are closed. In this manner, high voltages can be obtained. On the other hand, if the switches 81 are open, each cell can be isolated from the others. Using microswitches 81, a number of cells can be temporarily connected in parallel, i.e. all of the negative electrodes from each cell are in electrical contact one with another, and all of the positive electrodes from each cell are in electrical contact one with another. In this manner, a given group of cells can be arranged as isolated individual cells, as a series-connected string of cells, as a parallel-connected group of cells, or in some combination thereof, depending on the location and condition of various microswitches. One useful application of this concept is the series-connection of cells used to achieve a high-voltage discharge, and the subsequent parallel-connection of cells to achieve a low-voltage charge.

The Embodiment of FIG. 19

FIG. 19 depicts a microscopic battery 90 which comprises a pin or peg-in-a-block configuration. More specifically, microscopic battery 90 comprises a pin, peg or rod microscopic electrode 92, which accommodates wire bond connection at 94 to a MEMS or non-MEMS integrated circuit. Electrode 92 is of a predetermined microscopic diameter. Microscopic battery 90 also comprises a block or receptor microscopic electrode 96, which accommodates wire bond connection at 98 to the MEMS or non-MEMS integrated circuit. The microscopic receptor electrode 96 comprises a blind bore 100, the microdiameter of which is slightly greater than the diameter of microscopic rod electrode 92. The rod 92 and a suitable electrolyte are appropriately placed in the receptor 96, with the receptor vertically erect to complete assembly of the microscopic battery 90. Typically, the assembled battery 90 is sealed.

By way of example, the rod electrode 92 of the microscopic battery 90 may comprise nickel foam, while block electrode 96 may comprise zinc. A separator soaked in $KOH/H_2O$ may be interposed between the electrodes. The diameter of rod electrode 92 may be on the order of 1.65 mm, while the blind bore 100 may comprise a diameter on the order of 2.0 mm.

Solid Electrolyte

In some configurations, the present invention may comprise ultra thin solid electrolyte interposed between two microscopic electrodes. Despite their lower power performance relative to liquid electrolyte microscopic batteries, solid electrolyte microscopic batteries are attractive for applications which require, for example, batteries to bend or conform to a particular shape, or to operate over a broad range of temperatures.

Two different solid electrolyte materials, TMAOH (tetramethylammonium hydroxide pentahydrate) and PEO/KOH (polyethylene oxide/potassium hydroxide) were substantially tested. TMAOH is a solid electrolyte material which may comprise part of a solid-state Ni/MH (metal hydride) microscopic battery which provided current densities of 10 $mA/cm^2$, considerably more than that of other known solid-state batteries in the literature. PEO is a polymer to which a salt can be added to produce a finite ionic conductivity:

Lithium glass is a solid electrolyte heretofore used in lithium batteries. Polyethylene oxide containing ionically-conducting material may also comprise a solid electrolyte.

EXAMPLES OF ADAPTATION OF MICROSCOPIC BATTERIES TO MEMS TECHNOLOGY

An important aspect of the present invention is the adaptation of the novel microscopic battery technology disclosed herein to MEMS and like microcircuits. This unique combination solves long standing power source problems in each of the major user segments of the MEMS market, i.e. general military, space, and commercial. The illustrative applications discussed herein are remote sensing arrays (general military), flexible sensing surfaces (space), and smart sensors (commercial). Each of these applications illustrate the importance of an integrated microscopic battery with the system and the system constraints on the microscopic battery. It should be emphasized that numerous other MEMS applications exist for integratable microscopic batteries, in addition to those mentioned here.

Figure 20:
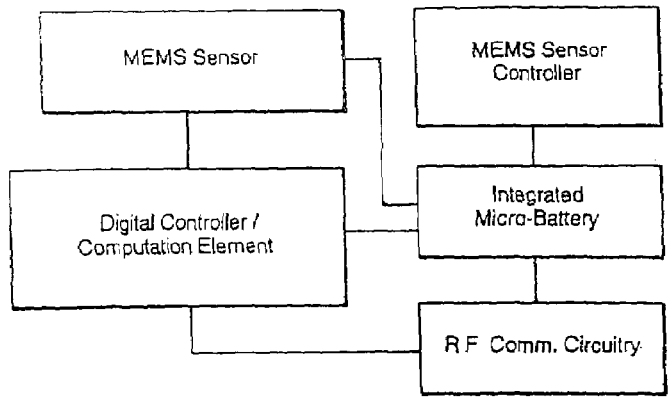
FIG. 20 is a block diagram of a MEMS sensor system comprising an integrated microscopic battery, among other things.
Figure 21:
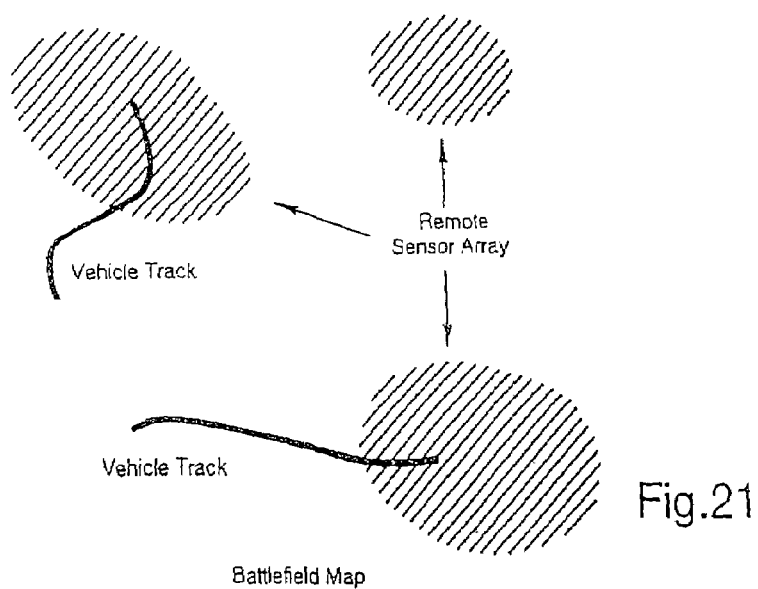
FIG. 21 is a plan schematic of a remote sensor array for military purposes.

FIG. 21 illustrates the use of a sensing array for battlefield context, while FIG. 20 is a block diagram of one way basic elements of a MEMS sensor system may be assembled and interconnected. The application typically calls for large numbers of small, autonomous sensors with the system capability to sense, analyze data, and communicate through RF. Microscopic batteries are critical for battlefield sensor purposes because: 1) the system must be autonomous and, therefore, must have its own, rechargeable power source which can be moved from place-to-place with the system; 2) the entire system including the integrated microscopic battery must be small to facilitate element delivery; and 3) components must be extensively integrated in order to accommodate mass production to provide a cost effective end result.

Two major challenges face a microscopic battery source of power for MEMS: i.e. (1) an integrated power source solution, and (2) provision of different operating voltages for the RF and digital portions of the system. It is desirable to provide a power dissipation requirement of 10 µW or more for the sensing element. The present invention achieves this requirement and is suitable for use with a MEMS as an integrated internal power source that is small. The present invention also provides a microscopic battery having two or more power supply voltages. The voltage supply required for the digital circuitry is approximately 1 volt while the voltage supply required for the RF communication circuitry is approximately 4 volts.

Figure 10:
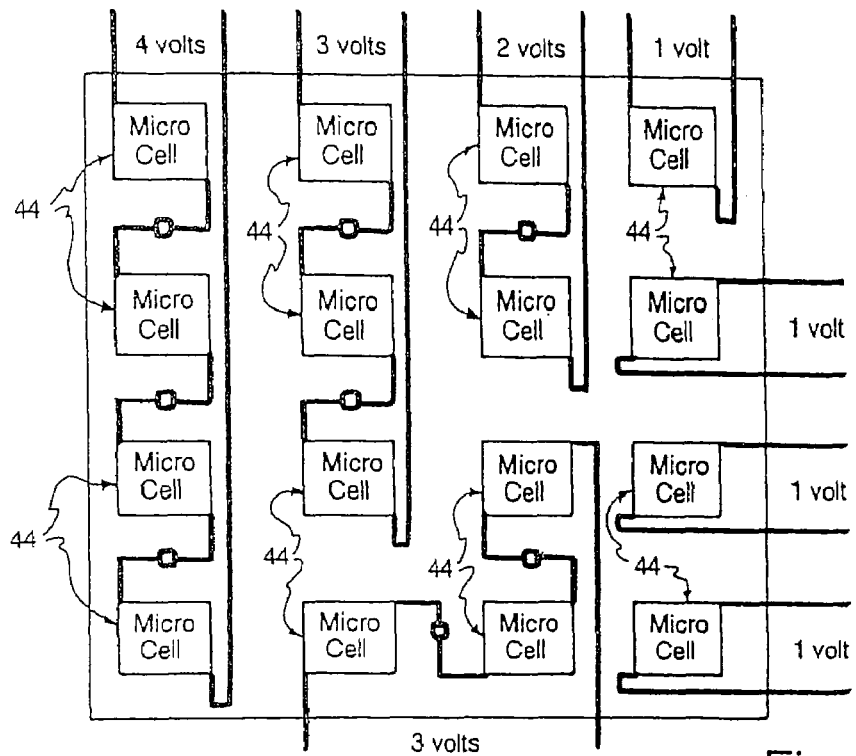
FIG. 10 is a schematic plan view showing microscopic battery cells of a microscopic battery system arranged to provide various voltage and current/capacity outputs.

The microscopic batteries of the invention meet the foregoing needs. The thin film nature of the battery facilitates inclusion as part of an integrated substrate which also carries MEMS circuitry. Photolithographic patterning of the electrode metallization makes possible custom connection of microbattery cells into partitions with differing output voltages in a single battery array. FIG. 10 shows a schematic of a microscopic battery that has been partitioned into a nominal 1.0 cell voltage section to power digital circuitry; a high-power, low-voltage section to power the MEMS-sensor; and, among other things, a smaller, lower current nominal 4.0 voltage section to power the RF circuitry. The operating voltage of a given cell can be up to 3.5 V. This thin-film microscopic battery can be integrated onto a single substrate together with a MEMS and/or another integrated circuit, using the parallel fabricating and mounting techniques. Any desired low voltage can be provided and the microscopic battery cell can be arranged or reconfigured into appropriate series and/or parallel arrangements to achieve one or more desired low voltages.

Remote Sensing Arrays

FIG. 20 illustrates the use of sensing arrays for battlefield awareness and FIG. 21 is a schematic indicating how individual elements might be arranged. The application calls for large numbers of small, autonomous sensors with the capability to sense, analyze data, and communicate through RF. Microscopic batteries are needed for this application because: 1) each element must be autonomous and therefore must have its own, rechargeable power source (it is impractical to use a primary battery to last the lifetime of the device), 2) the entire system must be small to facilitate element delivery, and 3) components of each element must be extensively integrated in order to keep costs reasonable for large arrays of elements.

In order to demonstrate the need for microbatteries, we will discuss a specific implementation of remote sensor array. Sensing systems according to the present invention integrate a motion sensor with digital logic and RF communication circuitry into a single small system. The system is intended to provide battlefield awareness through the distribution of the remote sensing elements over the battlefield area.

Two major challenges face a microscopic battery system for MEMS; an integrated power solution, and different operating voltages for the RF and digital portions of the system. FIG. 10 illustrates such an arrangement. One of the major limitations to improving the sensing system to provide a suitable MEMS comprising a power source that is small and is integrated into the system. Another challenge is the need for two power supply voltages; one for digital circuitry (approximately 1 volt) and another for the RF communication circuitry (approximately 4 volts).

The microscopic batteries of the invention meet these needs. The thin film nature of the battery facilitates inclusion in an integrated substrate with MEMS sensors and digital-analog circuitry. Photolithographic patterning of the electrode metallization makes possible custom connection of microbattery cells into partitions with differing voltages in a single battery array. FIG. 10 shows a schematic of a microbattery that has been partitioned into a 1.0 volt section to power digital circuitry; a high-power, low voltage section to power the MEMS-sensor; and a smaller, lower current 4.0 volt section to power the RF circuitry. This thin-film microbattery can be integrated onto a single substrate together with the MEMS sensor and the integrated circuits using the same assembly techniques used to mount and connect the other components.

Flexible Sensing Surfaces (Space)

Many space sensing systems will be greatly benefited by the present invention. Specifically, various forms of the present invention can be conformably mounted to a non-flat satellite or vehicle surface. Such surfaces require autonomous power sources. Solar cell recharging is an available option. The sensor, circuitry, microscopic battery, and solar cell or cells can all be mounted, for example, on a flexible membrane surface using conventional integrated circuit mounting techniques such as die attach/wire bonding, flip chip and/or TAB. Autonomous power sources are necessary in order to reduce power consumption and improve reliability.

A microscopic battery of this invention can be fabricated on a flexible substrate, such as Riston™, or can-be fabricated as part of the flexible membrane substrate on which integrated circuits and MEMS sensors are mounted. FIG. 4 shows the profile of an interconnection substrate that is rigid during processing, but with a flexible substrate that can be released by etching a sacrificial layer located beneath the flexible substrate. The sacrificial release process is widely used in surface micromachining processes.

This flexible substrate can also be used as a base upon which other system components are mounted. FIG. 4 illustrates the microscopic battery fabricated on a polymeric membrane that also serves as-the carrier for a MEMS or other integrated circuit (IC), as well as a solar cell for recharging the microscopic battery. The interconnections between components are illustrated as being wire bond, but may be flip chip or TAB. The rigid substrate serves as a temporary mounting base until fabrication of the microbattery and the system is complete. A protective coating, such as vapor-deposited Parylene; may be used to encapsulate all components. The sacrificial layer may typically be etched at room temperature using hydrofluoric acid. The flexible substrate or membrane itself can be used as part of a smart sensing surface in certain configurations.

It should be noted that this flexible base embodiment requires use of a microscopic battery that can be integrated upon and to the flexible substrate. The approach can be used to fabricate relatively large sensing surfaces.

Smart Sensors (Commercial)

The requirements for smart sensors are very similar to those for remote sensing arrays. Smart sensor applications exist where large numbers of autonomous sensors are needed, such as in inventory control, commercial security systems, and control of sensitive manufacturing processes. The components are the same components typically required for commercial smart sensor systems, although the integrated circuit and sensing elements may different somewhat. The need for an integrated microscopic battery is just as stringent for commercial smart sensing systems as for the military sensing systems. In fact, because the cost requirements are even more challenging, the need for an integrated microscopic battery solution for providing power to commercial smart sensing system may be greater.

It is anticipated that microscopic batteries will eventually find use in many other microelectronic circuits.

While this invention has been described with reference to certain specific embodiments and examples, it will be recognized by those skilled in the art that many variations are possible without departing from the scope and spirit of this invention, and that the invention, as described by the claims, is intended-to cover all changes and modifications of the invention which do not depart from the spirit of the invention.

What is claimed and desired to be secured by Letters Patent is:

1. A microfabricated battery comprising a system for internal storage of electricity comprising reactants, the microfabricated battery having a volumetric size which is microscopic including a micrometer footprint substantially less than 20 cm$^2$ and congruent with a microelectronic circuit accommodating integration with the circuit to provide long term stored power and to materially limit power losses, the microfabricated battery comprising a body of material having a first microfabricated electrode of chemically reactant material, a second microfabricated electrode spaced from the first electrode and a microscopic amount of internal ion-transmitting electrolyte which restricts electronic current flow and accommodates reactions at the electrodes contained within an internal microfabricated space in the body accessible to both electrodes.

2. The microfabricated battery according to claim 1 wherein the microfabricated battery is rechargeable.

3. The microfabricated battery according to claim 1 wherein the microfabricated battery is primary.

4. The microfabricated battery according to claim 1 further comprising an autonomous sensor system integrated with the microfabricated battery.

5. The microfabricated battery according to claim 4 wherein the autonomous sensor system senses conditions, analyzes data, and issues radio frequency signals.

6. The microfabricated battery according to claim 1 wherein at least one of the electrodes comprises a microfabricated film of conductive material.

7. The microfabricated battery according to claim 1 wherein the electrodes are held apart by a separator comprising the electrolyte.

8. The microfabricated battery according to claim 1 wherein the electrodes are carried on a rigid dielectric substrate.

9. The microfabricated battery according to claim 1 wherein the electrodes are carried on a flexible sheet.

10. The microfabricated battery according to claim 1 wherein the electrodes are created by metallic deposition, thin layer lithographic patterning and etching.

11. The microfabricated battery according to claim 1 wherein the electrodes comprise an etched profile obtained by removing sacrificial material.

12. The microfabricated battery according to claim 1 wherein the second microfabricated electrode is comprised of a chemical reactant material.

13. The microfabricated battery according to claim 7 wherein the separator is comprised of polymeric material.

14. The microfabricated battery according to claim 7 wherein the separator is comprised of a dielectric material.

15. The microfabricated battery according to claim 7 wherein the separator comprises both solid and liquid materials.

16. A method comprising the acts of:
fabricating a microfabricated electrical energy storage battery comprised of reactant microfabricated electrodes by which an electrical charge is chemically transferred and having a microscopic footprint substantially less than 20 cm$^2$ which is size-congruent and electronically compatible with a microelectromechanical system;
integrating the microfabricated battery into the microelectromechanical system as an integrated internal source of electrical power.

17. A method comprising the acts of:
fabricating a microfabricated electrical energy storage battery comprised of chemical reactant microfabricated electrodes and having a microscopic footprint substantially less than 20 cm$^2$ which is size-congruent, material-compatible and electronically suitable to be integrated into microcircuitry;
integrating the microfabricated battery with the microcircuitry as a long term internally-derived source of electrical power.

18. The microfabricated battery according to claim 17 wherein the microcircuitry is selected from the group consisting of a microelectromechanical system and a non-microelectromechanical microcircuit.

19. A method comprising the acts of:
fabricating a microfabricated electrical energy storage battery comprising a microscopic footprint substantially less than 20 cm$^2$ which is size-congruent material-compatible and electronically-suitable to be integrated as a power source into a microfabricated circuit;
integrating the microfabricated battery into the microfabricated circuit as a fully integrated internally derived source of electrical power.

20. A method of making a microfabricated battery for internal storage of electricity comprising the acts of:
forming spaced film microfabricated electrode layers of reactant materials upon non-conducting material, each layer having a microfabricated volume comprising a footprint substantially less than 20 cm$^2$;
etching away sacrificial portions of at least one film microfabricated electrode layer of reactant material;
interposing reaction-accommodating electrolyte between the remaining microfabricated electrode layers of reactant material within a housing so that the electrode layers serve as internal only sources of reactants.

21. The method according to claim 20 further comprising the act of interposing a microfabricated separator in communication with the electrolyte between the microfabricated electrode layers.

22. The method according to claim 21 wherein the microfabricated separator is etched to provide a cavity for the electrolyte.

23. The method according to claim 20 further comprising the act of interposing a non-conductive microfabricated polymeric separator in communication with the electrolyte between the microfabricated electrode layers.

24. A conformable microfabricated battery comprising microfabricated volume and an internal only source of electricity having a first microfabricated electrode of reactant material in the form of a microscopic wire, reaction-accommodating electrolyte concentrically disposed around the microscopic wire and a second hollow tubular microscopic electrode of reactant material concentrically surrounding the electrolyte, the surface area of which is microscopic and substantially less than 20 cm$^2$.

25. The conformable microfabricated battery according to claim 24 wherein the electrolyte is aqueous.

26. The conformable microfabricated battery according to claim 25 wherein the aqueous electrolyte is disposed in a porous material.

27. The conformable microfabricated battery according to claim 24 wherein the electrolyte is solid.

28. A rechargeable microfabricated battery comprising an internally operated source of electricity comprising internal only reactants in the nature of first and second spaced microfabricated electrodes, each being microfabricated to a microscopic volume and comprising a microfabricated footprint substantially less than 20 cm² and a microscopic amount of aqueous reaction-accommodating electrolyte disposed in a microfabricated cavity between the reactant microfabricated electrodes.

29. A method of making a microfabricated battery comprising an internally operated source of electricity comprising internal only reactants, the method comprising the seriatim acts of depositing as microfabricated film a microscopic internal reactant in the nature of a first microfabricated electrode, a spacer and a microscopic internal reactant in the nature of a second microfabricated electrode comprising a footprint substantially smaller than 20 cm², etching a part of the spacer to create a microfabricated cavity which accesses to both electrodes and filling the microfabricated cavity with aqueous reaction-accommodating electrolyte through a passageway in one of the thin films.

30. The method according to claim 29 wherein the filling act is through a passageway in one of the microfabricated electrodes.

31. A microfabricated battery comprising at least one cell comprising spaced microfabricated reactant electrodes and a microscopic amount of reaction-accommodating electrolyte disposed between the reactant microfabricated electrodes, the battery providing specific power within the range of $10^{-0.4}$ to $10^{1.6}$ KW/kg and specific energy within the range of $10^{1.1}$ to $10^{2.1}$ kJ/kg.

* * * * *